US009985182B2

(12) United States Patent
Watanabe et al.

(10) Patent No.: US 9,985,182 B2
(45) Date of Patent: May 29, 2018

(54) LIGHT-EMITTING APPARATUS AND COLOR-MATCHING APPARATUS

(71) Applicants: CITIZEN ELECTRONICS CO., LTD., Fujiyoshida-shi, Yamanashi (JP); CITIZEN WATCH CO., LTD., Tokyo (JP)

(72) Inventors: Yuka Watanabe, Fujiyoshida (JP); Takakazu Yano, Tokyo (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days. days.

(21) Appl. No.: 15/388,636

(22) Filed: Dec. 22, 2016

(65) Prior Publication Data
US 2017/0196060 A1    Jul. 6, 2017

(30) Foreign Application Priority Data

Dec. 25, 2015 (JP) .................................. 2015-255214
Dec. 20, 2016 (JP) .................................. 2016-246966

(51) Int. Cl.
H05B 33/08  (2006.01)
H01L 33/50  (2010.01)
(Continued)

(52) U.S. Cl.
CPC .......... *H01L 33/32* (2013.01); *H01L 25/0753* (2013.01); *H01L 33/504* (2013.01);
(Continued)

(58) Field of Classification Search
None
See application file for complete search history.

(56) References Cited

U.S. PATENT DOCUMENTS

2006/0071591 A1* 4/2006 Takezawa ........... B29C 45/0013
313/501
2007/0152229 A1* 7/2007 Yoshida ............. B29C 45/14655
257/98
(Continued)

FOREIGN PATENT DOCUMENTS

JP  2009-135080 A   6/2009
JP  2010-232525 A   10/2010
(Continued)

Primary Examiner — Crystal L Hammond
(74) Attorney, Agent, or Firm — RatnerPrestia

(57) ABSTRACT

Provided is a light-emitting apparatus including a board, a resin frame fixed on the board, sets of light-emitting elements mounted in a region on the board surrounded by the resin frame, wherein the light-emitting elements configuring each set are connected in series to each other. The light-emitting apparatus further includes connection electrodes provided on the board and electrically connected to the light-emitting elements and capable of supplying a drive current selectively to the sets of light-emitting elements, and a sealing resin which includes a phosphor mixed therein and excited by light from the light-emitting elements, and is filled so as to bury the region on the board, to seal integrally the light-emitting elements. The thickness of the sealing resin immediately above the light-emitting elements differs for the respective sets, and thereby, a chromaticity of light emitted from the sealing resin differs when each set of light-emitting elements emits the light singly.

9 Claims, 19 Drawing Sheets

(51) Int. Cl.
   *H01L 33/32*      (2010.01)
   *H01L 33/56*      (2010.01)
   *H01L 25/075*     (2006.01)
   *H01L 33/54*      (2010.01)
   *H01L 33/60*      (2010.01)
   *H01L 33/62*      (2010.01)

(52) U.S. Cl.
   CPC .............. *H01L 33/54* (2013.01); *H01L 33/56* (2013.01); *H01L 33/60* (2013.01); *H01L 33/62* (2013.01); *H05B 33/0806* (2013.01); *H01L 2224/48137* (2013.01)

(56) References Cited

U.S. PATENT DOCUMENTS

| | | | | |
|---|---|---|---|---|
| 2008/0284315 | A1* | 11/2008 | Tasumi | G02B 6/0083 313/503 |
| 2009/0134415 | A1* | 5/2009 | Morioka | H01L 33/56 257/98 |
| 2009/0135599 | A1 | 5/2009 | Lin et al. | |
| 2009/0295266 | A1* | 12/2009 | Ramer | F21V 7/0008 313/113 |
| 2010/0133556 | A1* | 6/2010 | Li | F21K 9/00 257/88 |
| 2010/0246210 | A1* | 9/2010 | Yashiro | G02B 6/0026 362/606 |
| 2011/0085352 | A1* | 4/2011 | Ito | H01L 33/50 362/617 |
| 2011/0102706 | A1* | 5/2011 | Oshio | H01L 25/0753 349/61 |
| 2012/0148820 | A1* | 6/2012 | Okuya | B29C 33/68 428/220 |
| 2012/0200687 | A1* | 8/2012 | Kikuchi | A61B 1/041 348/68 |
| 2012/0211774 | A1* | 8/2012 | Harada | H01L 33/56 257/88 |
| 2012/0236582 | A1* | 9/2012 | Waragaya | H01L 33/507 362/510 |
| 2012/0286310 | A1* | 11/2012 | Kim | H01L 33/642 257/98 |
| 2012/0320277 | A1* | 12/2012 | Takata | G02B 6/003 348/725 |
| 2013/0001633 | A1* | 1/2013 | Imai | H01L 33/60 257/99 |
| 2013/0114022 | A1* | 5/2013 | Iiyama | G02B 19/0014 349/64 |
| 2013/0193839 | A1* | 8/2013 | Kobayashi | H01L 33/504 313/502 |
| 2013/0234622 | A1* | 9/2013 | Tanaka | H01L 25/0753 315/307 |
| 2014/0293608 | A1* | 10/2014 | Kanahira | H01L 25/0753 362/293 |
| 2016/0060073 | A1* | 3/2016 | Hata | B65H 75/14 242/176 |
| 2016/0097495 | A1* | 4/2016 | Yamamoto | G02B 6/0073 349/65 |
| 2016/0116140 | A1* | 4/2016 | Eguchi | H01L 25/0753 362/293 |
| 2016/0149094 | A1* | 5/2016 | Onuma | H01L 25/0753 257/89 |
| 2017/0038051 | A1* | 2/2017 | Fukasawa | F21V 29/503 |
| 2017/0211761 | A1* | 7/2017 | Kuriki | F21S 2/005 |
| 2017/0250324 | A1* | 8/2017 | Seki | H01L 33/504 |

FOREIGN PATENT DOCUMENTS

| | | |
|---|---|---|
| JP | 2012-009530 A | 1/2012 |
| JP | 2012-069787 A | 4/2012 |

* cited by examiner

FIG. 6

|  | YELLOW PHOSPHOR | RED PHOSPHOR | INTENSITY IN BLUE COLOR | CHROMATICITY x | CHROMATICITY y |
|---|---|---|---|---|---|
| (1) | 100% | 0% | 14.7% | 0.354 | 0.367 |
|  | 100% | 0% | 15% | 0.352 | 0.365 |
|  | 100% | 0% | 16.3% | 0.346 | 0.354 |
|  | 100% | 0% | 17% | 0.342 | 0.348 |
|  | 100% | 0% | 18.2% | 0.337 | 0.339 |
| (2) | 92.1% | 7.9% | 11.5% | 0.373 | 0.386 |
|  | 92.1% | 7.9% | 12% | 0.371 | 0.382 |
|  | 92.1% | 7.9% | 13% | 0.365 | 0.373 |
|  | 92.1% | 7.9% | 13.7% | 0.361 | 0.367 |
|  | 92.1% | 7.9% | 15% | 0.354 | 0.356 |
|  | 92.1% | 7.9% | 15.4% | 0.352 | 0.352 |
| (3) | 81.5% | 18.5% | 8.7% | 0.396 | 0.401 |
|  | 81.5% | 18.5% | 9% | 0.394 | 0.398 |
|  | 81.5% | 18.5% | 10% | 0.387 | 0.388 |
|  | 81.5% | 18.5% | 10.8% | 0.382 | 0.380 |
|  | 81.5% | 18.5% | 12% | 0.375 | 0.369 |
|  | 81.5% | 18.5% | 13.2% | 0.368 | 0.358 |
| (4) | 70% | 30% | 6.3% | 0.421 | 0.412 |
|  | 70% | 30% | 7% | 0.416 | 0.404 |
|  | 70% | 30% | 8.0% | 0.408 | 0.393 |
|  | 70% | 30% | 9% | 0.400 | 0.382 |
|  | 70% | 30% | 10% | 0.393 | 0.372 |
| (5) | 60% | 40% | 4% | 0.451 | 0.425 |
|  | 60% | 40% | 5% | 0.441 | 0.412 |
|  | 60% | 40% | 5.8% | 0.434 | 0.403 |
|  | 60% | 40% | 7% | 0.423 | 0.389 |
|  | 60% | 40% | 7.5% | 0.419 | 0.383 |
| (6) | 52% | 48% | 2.7% | 0.474 | 0.430 |
|  | 52% | 48% | 3% | 0.470 | 0.426 |
|  | 52% | 48% | 4.1% | 0.458 | 0.410 |
|  | 52% | 48% | 5% | 0.449 | 0.400 |
|  | 52% | 48% | 5.7% | 0.442 | 0.391 |

FIG. 12

|  | GREEN PHOSPHOR | RED PHOSPHOR | INTENSITY IN BLUE COLOR | CHROMATICITY x | CHROMATICITY y |
|---|---|---|---|---|---|
| (1) | 53.5% | 46.5% | 7.3% | 0.337 | 0.342 |
|  | 53.5% | 46.5% | 7% | 0.339 | 0.345 |
|  | 53.5% | 46.5% | 6.1% | 0.345 | 0.355 |
|  | 53.5% | 46.5% | 5% | 0.352 | 0.367 |
|  | 53.5% | 46.5% | 4.6% | 0.354 | 0.370 |
| (2) | 50.5% | 49.5% | 3.0% | 0.374 | 0.387 |
|  | 50.5% | 49.5% | 4% | 0.366 | 0.375 |
|  | 50.5% | 49.5% | 4.7% | 0.361 | 0.366 |
|  | 50.5% | 49.5% | 5.0% | 0.359 | 0.363 |
|  | 50.5% | 49.5% | 5.9% | 0.352 | 0.353 |
| (3) | 46.9% | 53.1% | 1.5% | 0.396 | 0.402 |
|  | 46.9% | 53.1% | 2% | 0.392 | 0.395 |
|  | 46.9% | 53.1% | 3% | 0.383 | 0.382 |
|  | 46.9% | 53.1% | 3.2% | 0.382 | 0.380 |
|  | 46.9% | 53.1% | 4% | 0.375 | 0.370 |
|  | 46.9% | 53.1% | 5.0% | 0.367 | 0.358 |
| (4) | 42.5% | 57.5% | 0.5% | 0.420 | 0.411 |
|  | 42.5% | 57.5% | 1% | 0.415 | 0.404 |
|  | 42.5% | 57.5% | 1.8% | 0.407 | 0.393 |
|  | 42.5% | 57.5% | 3% | 0.396 | 0.377 |
|  | 42.5% | 57.5% | 3.5% | 0.391 | 0.370 |
| (5) | 38% | 62% | 0.1% | 0.441 | 0.412 |
|  | 38% | 62% | 0.7% | 0.434 | 0.403 |
|  | 38% | 62% | 1% | 0.430 | 0.398 |
|  | 38% | 62% | 2.1% | 0.418 | 0.383 |
| (6) | 33.9% | 66.1% | 0.0% | 0.458 | 0.408 |
|  | 33.9% | 66.1% | 0.5% | 0.451 | 0.400 |
|  | 33.9% | 66.1% | 1.2% | 0.443 | 0.390 |

…

LIGHT-EMITTING APPARATUS AND COLOR-MATCHING APPARATUS

CROSS REFERENCE TO RELATED APPLICATION

This application is a new U.S. patent application that claims benefit of JP2015-255214, filed on Dec. 25, 2015, and JP2016-246966, filed on Dec. 20, 2016. The entire contents of these applications are hereby incorporated by reference.

TECHNICAL FIELD

The present invention relates to a light-emitting apparatus and a color-matching apparatus.

BACKGROUND

Japanese Unexamined Patent Publication No. 2010-232525 describes an LED (Light-Emitting Diode) light source which enables easy chromaticity adjustment while keeping its external shape almost unchanged, with a little damage given in processes of the chromaticity adjustment. The LED light source includes an LED element, a sealing material disposed around the LED element and including a phosphor which absorbs some of light emitted from the LED element, converts its wavelength, and re-emits it, a recess formed of the cut sealing material, and a resin for adjusting chromaticity which is different from the sealing material filled in whole of the recess.

Japanese Unexamined Patent Publication No. 2012-009530 describes a bare-chip-mounting surface light emitter in which bare chips of light-emitting diode emitting any of red, green, and blue lights are connected to conductive patterns on a resin board, and a first convex coating layer is formed, for respective sets composed of these bare chips, adjacently at approximately even intervals on the board, and a second coating layer is further formed over whole of the board.

Japanese Unexamined Patent Publication No. 2012-069787 describes a light-emitting apparatus including two or more independently driven light-emitting element chips and an integral phosphor layer covering the two or more light-emitting element chips, wherein the integral phosphor layer is formed so that the thickness thereof at a location where at least one of the light-emitting element chips is covered is different from that at a location where another light-emitting element chip is covered.

SUMMARY

In a COB (Chip On Board) light-emitting apparatus in which multiple light-emitting elements such as blue LEDs are mounted on a single board and sealed with a phosphor-containing resin and light from the light-emitting elements is re-emitted through wavelength-conversion by the phosphor, the chromaticity of the emitted light varies slightly in every product, for example, depending on the thickness of the sealing resin, and chromaticity shift may occur due to temperature rise inside the apparatuses during operation thereof. However, for such a light-emitting apparatus, the chromaticity of the respective products is impossible to be adjusted independently, and therefore it is difficult to correct chromaticity variation for the respective products and chromaticity shift during operation of the apparatus.

Accordingly, it is an object of the present invention to provide a light-emitting apparatus and a color-matching apparatus capable of adjusting the chromaticity of emitted light to multi-levels.

Provided is a light-emitting apparatus including a board, a resin frame fixed on the board, a plurality of sets of light-emitting elements which are mounted in a region on the board surrounded by the resin frame, wherein the light-emitting elements configuring each of the sets are connected in series to each other. The light-emitting apparatus further includes a plurality of pairs of connection electrodes which are provided on the board, and electrically connected to the plurality of sets of light-emitting elements and capable of supplying a drive current selectively to some of the plurality of sets of light-emitting elements, and a sealing resin which includes a phosphor mixed therein and excited by light from the plurality of sets of light-emitting elements, and is filled in such a way as to bury the region on the board surrounded by the resin frame, to seal integrally the plurality of sets of light-emitting elements. A thickness of the sealing resin immediately above the plurality of sets of light-emitting elements differs for the respective sets, and thereby, a chromaticity of light emitted from the sealing resin differs when each of the sets of light-emitting elements emits the light singly.

Preferably, in the above light-emitting apparatus, the thickness of the sealing resin in a location where the plurality of sets of light-emitting elements are mounted is determined so that a chromaticity value of the emitted light may fall within a range of ±2% around a chromaticity value of a center point of a region on a chromaticity diagram corresponding to one of a plurality of white colors classified based on Correlated Color Temperatures according to the ANSI C78.377 standard.

Preferably, the plurality of sets of light-emitting elements are mounted on a horizontal mounting surface of the board, a height of the resin frame from the mounting surface gradually decreases from one side of the board to the other side of the board opposed to the one side, and the sealing resin seals the plurality of sets of light-emitting elements so that the thickness of the sealing resin may gradually decrease from the one side to the other side.

Preferably, the board includes a mounting surface sloping with respect to a horizontal plane, the plurality of sets of light-emitting elements are mounted on the sloping mounting surface, a height of the resin frame from the mounting surface increases with decrease in a height of the mounting surface from the horizontal plane, so that an upper end of the resin frame is kept positioned on an identical horizontal plane throughout a circumference of the resin frame, and an upper end of the sealing resin is on the identical horizontal plane.

Preferably, the board is configured by a metal mounting board an upper surface of which is the sloping mounting surface and a circuit board having a uniform thickness and an opening, the circuit board being fixed to the upper surface of the mounting board and including the plurality of pairs of connection electrodes formed thereon, and the plurality of sets of light-emitting elements are mounted on the upper surface of the mounting board exposed in the opening.

Preferably, the board includes a plurality of horizontal planes having a different height in a vertical direction due to steps formed on an upper surface of the board, each of the sets of light-emitting elements is mounted in a location on the different height, and an upper end of the sealing resin is on an identical horizontal plane.

Preferably, the board is configured by a metal mounting board and a circuit board, the metal mounting board having the plurality of horizontal planes, and the circuit board having a uniform thickness and an opening, being fixed to an upper surface of the mounting board, and including the plurality of pairs of connection electrodes formed thereon, and the plurality of sets of light-emitting elements are mounted on the upper surface of the mounting board exposed in the opening.

Preferably, any one of a plurality of light-emitting elements configuring the same set has the same emission wavelength band, and some of the sets of light-emitting elements have an emission wavelength band different from that of the other sets of light-emitting elements.

Further, provided is a color-matching apparatus including a board, a resin frame fixed on the board, a plurality of sets of light-emitting elements which are mounted in a region on the board surrounded by the resin frame, wherein the light-emitting elements configuring each of the sets are connected in series to each other. The color-matching apparatus further includes a plurality of pairs of connection electrodes which are provided on the board, and electrically connected to the plurality of sets of light-emitting elements and capable of supplying a drive current selectively to some of the plurality of sets of light-emitting elements, a sealing resin which includes a phosphor mixed therein and excited by light from the plurality of sets of light-emitting elements, and is filled in such a way as to bury the region on the board surrounded by the resin frame, to seal integrally the plurality of sets of light-emitting elements, and a constant-current power supply connected to at least one of the plurality of pairs of connection electrodes, for supplying a drive current to a corresponding one of the plurality of sets of light-emitting elements so that light having a chromaticity corresponding to the set is emitted through the sealing resin. A thickness of the sealing resin immediately above the plurality of sets of light-emitting elements differs for the respective sets, and thereby, a chromaticity of light emitted from the sealing resin differs when each of the sets of light-emitting elements emits the light singly.

The above light-emitting apparatus and color-matching apparatus are capable of adjusting the chromaticity of emitted light to multi-levels.

BRIEF DESCRIPTION OF THE DRAWINGS

Other features and advantages of the present invention will be apparent from the ensuing description, taken in conjunction with the accompanying drawings, in which:

FIG. 6 is a table illustrating an example of a correspondence between chromaticity of emitted light and intensity of blue light included in the emitted light;

FIG. 12 is a table illustrating another example of the correspondence between the chromaticity of emitted light and the intensity in blue color included in the emitted light;

DESCRIPTION

Hereinafter, with reference to the accompanying drawings, a light-emitting apparatus and a color-matching apparatus will be explained in detail. However, it should be noted that the present invention is not limited to the drawings or the embodiments described below.

Figure 1:
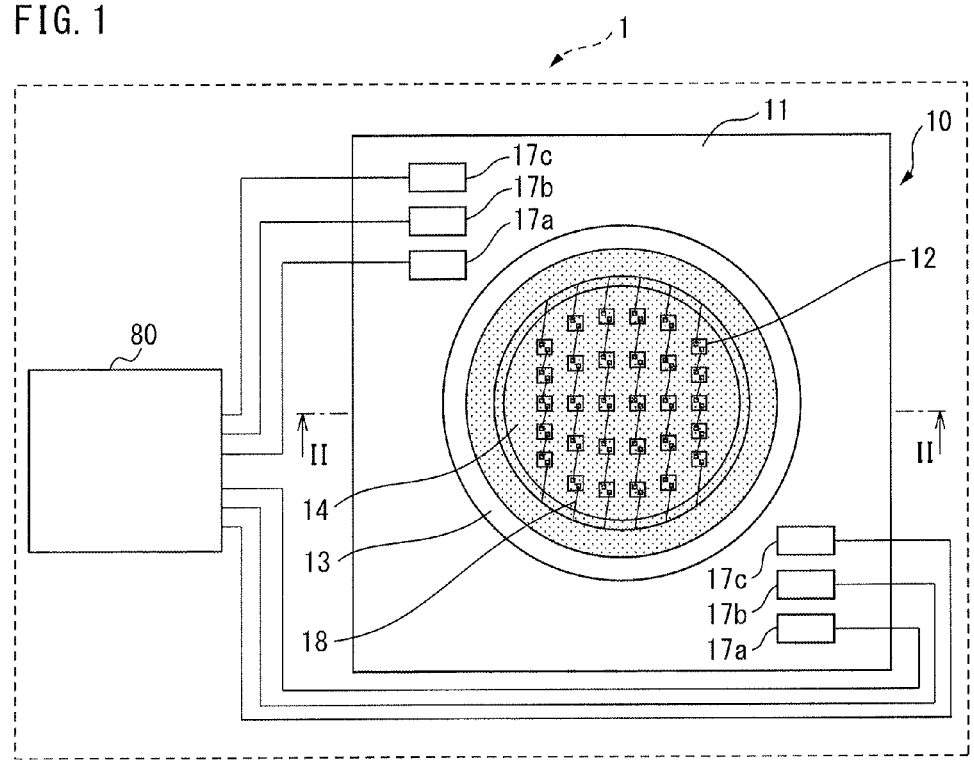
FIG. 1 is a schematic configuration diagram of a color-matching apparatus 1.
Figure 2:
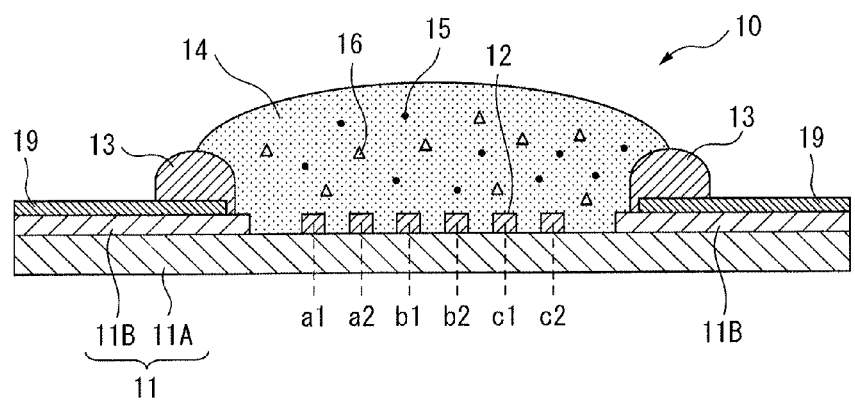
FIG. 2 is a vertical cross-sectional view of a light-emitting apparatus 10 along the II-II line in FIG. 1.

FIG. 1 is a schematic configuration diagram of a color-matching apparatus 1. FIG. 2 is a vertical cross-sectional view of a light-emitting apparatus 10 along the II-II line in FIG. 1. The color-matching apparatus 1 includes a light-emitting apparatus 10 and a constant-current power supply 80, and the light-emitting apparatus 10 includes a board 11, LED elements 12, a resin frame 13, and a sealing resin 14. The light-emitting apparatus 10 is a COB LED module in which non-packaged multiple LED elements (LED dies) 12 are directly mounted on the board 11, and this light-emitting apparatus is used as an LED light source of various illuminating apparatuses.

Figure 3:
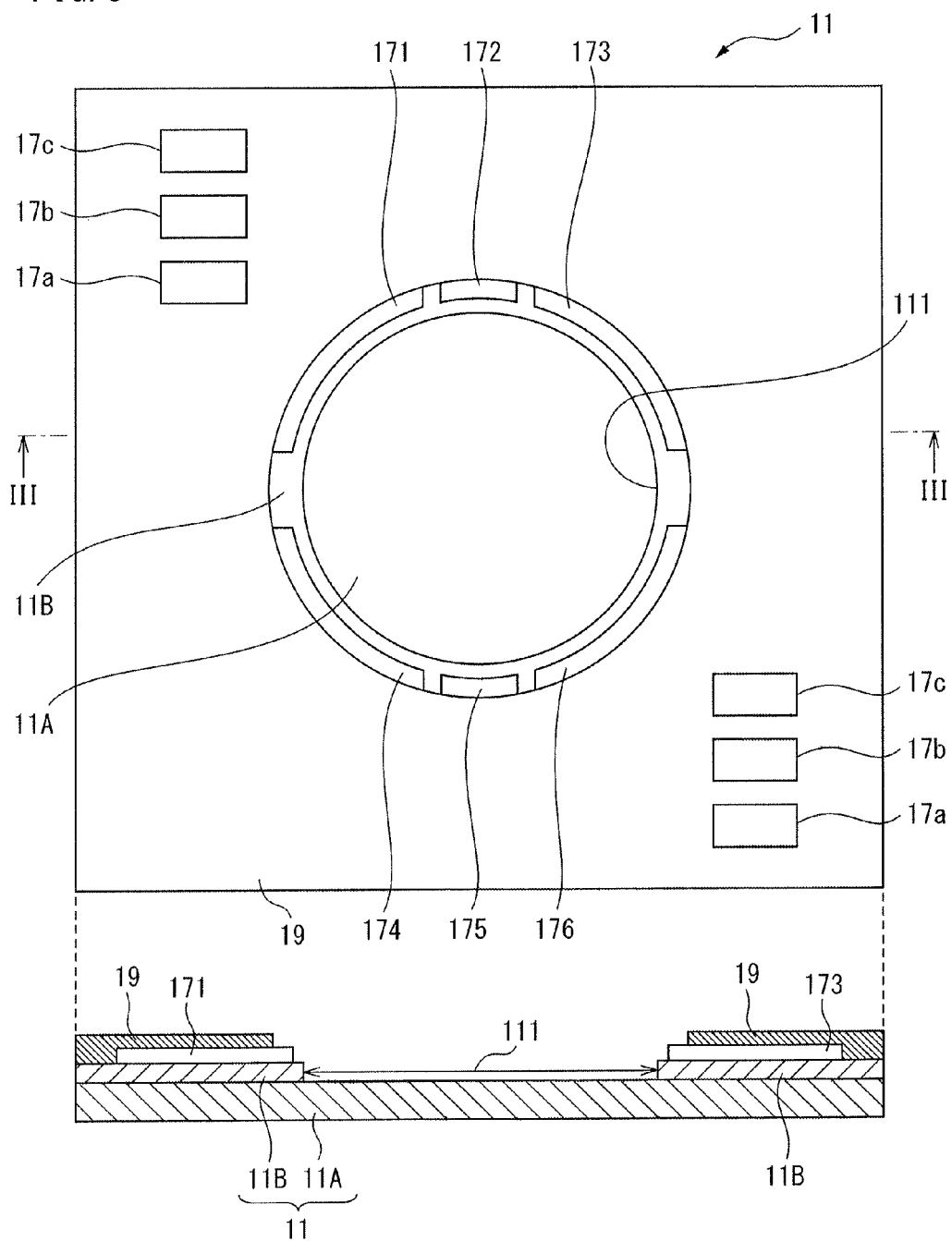
FIG. 3 is a combination of a top view and a vertical cross-sectional view of the board 11.
Figure 4:
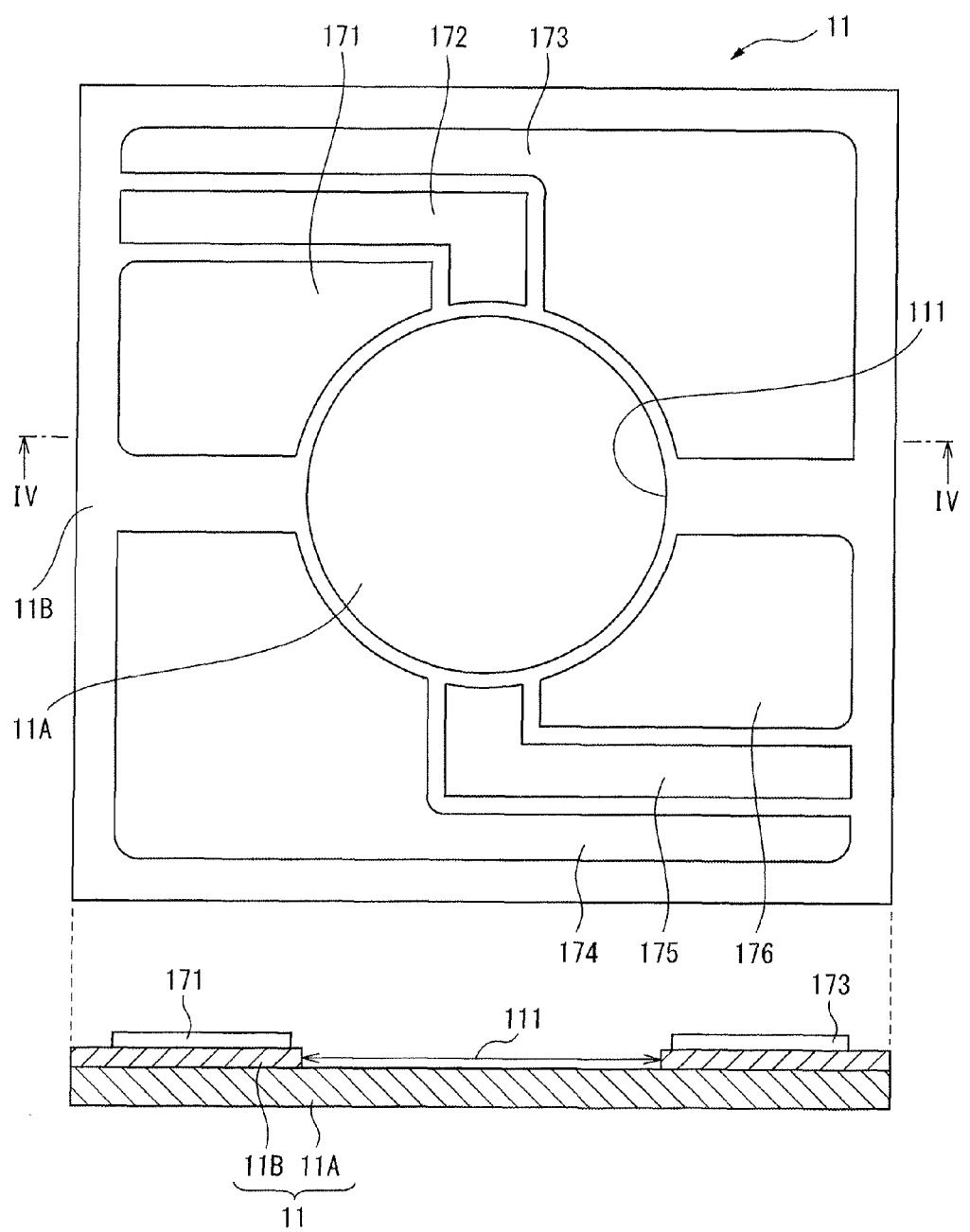
FIG. 4 is a combination of a top view and a vertical cross-sectional view of the board 11 after removal of the white resist 19.

FIG. 3 is a combination of a top view and a vertical cross-sectional view of the board 11. The board 11 is configured by a mounting board 11A and a circuit board 11B laminated on the mounting board 11A, and a white resist 19 is provided on the upper surface of the circuit board 11B except in a partial region of the surface. FIG. 4 is a combination of a top view and a vertical cross-sectional view of the board 11 after removal of the white resist 19. The cross-sectional view of FIG. 3 illustrates a cross-section of the board 11 along the III-III line in the top view of FIG. 3, and the cross-sectional view of FIG. 4 also illustrates a cross-section of the board 11 along the IV-IV line in the top view of FIG. 4.

The mounting board 11A is a flat metal board, for example, made of aluminum excellent in heat resistance and heat dissipation and having the LED elements 12 mounted on the upper surface thereof, and has a rectangular shape in a size of several cm. The mounting board 11A also functions as a heat dissipation board for dissipating heat generated by the LED elements 12 and phosphor particles as will be described later. The material of the mounting board 11A may be another metal such as copper as long as it is excellent in heat resistance and heat dissipation.

The circuit board 11B is an insulating board such as a glass epoxy board, and has, as an example, a rectangular shape of the same size as that of the mounting board 11A. The circuit board 11B is aligned in such a way that the end portion thereof is aligned with that of the mounting board 11A, and the lower surface of the circuit board is attached to the upper surface of the mounting board 11A by, for example, an adhesive sheet and fixed thereto. As illustrated in FIG. 3 and FIG. 4, a circular opening (through hole) 111 is formed at the center of the circuit board 11B.

As illustrated in FIG. 4, six conductive patterns 171 to 176 for supplying electric power to the LED elements 12 are provided on the upper surface of the circuit board 11B. Among these patterns, conductive patterns 171 to 173 surround the upper half of the opening 111 in FIG. 4 and extend from there to the upper left corner of the circuit board 11B. Conductive patterns 174 to 176 have a shape rotationally symmetrical (point-symmetrical) to the conductive patterns 171 to 173 with respect to the center of the circuit board 11B, surround the lower half of the opening 111 in FIG. 4, and extend from there to the lower right corner of the circuit board 11B.

As illustrated in FIG. 3, at the upper left and the lower right corners which are two opposing corners on the upper surface of the circuit board 11B, there are six rectangular portions where the white resist 19 is not provided and the conductive patterns 171 to 176 are exposed. These rectangular portions correspond to connection electrodes 17a to 17c for connecting the light-emitting apparatus 10 to an external power supply. The connection electrodes 17a to 17c correspond to the pair of conductive patterns 171 and 174, the pair of conductive patterns 172 and 175, and the pair of conductive patterns 173 and 176, respectively. The three pairs (three sets, three systems) of electrodes are provided by the conductive patterns 171 to 176 in the light-emitting apparatus 10. In each pair of connection electrodes 17a to 17c, one is an anode and the other is a cathode, and they are connected to the constant-current power supply 80. Hereinafter, when the connection electrodes 17a to 17c are not distinguished from each other, they are simply referred to as "connection electrodes 17".

The LED elements 12 are an example of light-emitting elements and are semiconductor blue-light-emitting elements (blue LEDs), for example, made of an InGaN compound semiconductor, the emission spectrum of which has a peak around 450 nm. For example, each of the LED elements 12 has a pair of element electrodes on its upper surface, and the lower surface of the LED element 12 is fixed, with an adhesive such as transparent insulating adhesive, to the upper surface of the mounting board 11A exposed in the opening 111. In the light-emitting apparatus 10, five LED elements 12 are combined into one set, and six sets, i.e., thirty LED elements 12 in total, are mounted on the mounting board 11A. The element electrodes of LED elements 12 within the same set are connected to each other by bonding wires 18, and bonding wires 18 from LED elements 12 located at the end of the respective sets are connected to any of the conductive patterns 171 to 176.

Figure 5:
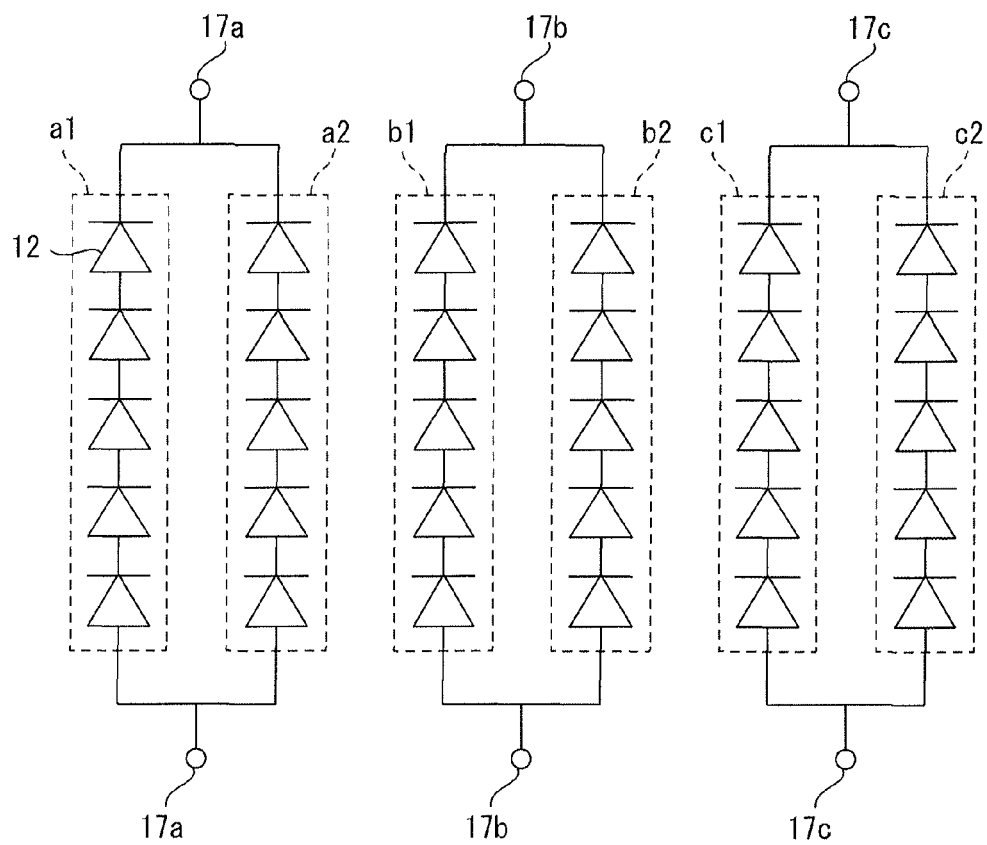
FIG. 5 is a diagram illustrating an example of a connection relation of the LED elements 12.

FIG. 5 is a diagram illustrating an example of a connection relation of the LED elements 12. In each of the six sets of LED elements 12, the five LED elements 12 configuring the set are connected in series. Sets of LED elements 12 denoted by reference numerals a1 and a2 in FIG. 5 are connected to the connection electrodes 17a, those denoted by reference numerals b1 and b2 are connected to the connection electrodes 17b, and those denoted by reference numerals c1 and c2 are connected to the connection electrodes 17c.

The connection of one or more of the connection electrodes 17a to 17c to the constant-current power supply 80 enables the light-emitting apparatus 10 to supply selectively a drive current to one or more sets of LED elements 12 corresponding to these connection electrodes. In the light-emitting apparatus 10, the multiple sets of connection electrodes 17a to 17c provided therein allows supplying a predetermined amount of drive current independently to corresponding sets of LED elements 12. As will be described later, chromaticities of emitted light from the sets a1 to c2 of LED elements 12 are different from each other, and therefore, the light-emitting apparatus 10 drives one or more sets a1 to c2 of LED elements 12 in accordance with a desired chromaticity.

In the light-emitting apparatus 10, all of the LED elements 12 are blue LEDs, and therefore, LED elements 12 configuring the same set each have the same band of emission wavelength. However, all of the LED elements 12 in the light-emitting apparatus 10 do not necessarily have the same band of emission wavelength. For example, some sets of LED elements 12 may be semiconductor green-light-emitting elements (green LEDs) configured by, for example, an InGaN compound semiconductor, the emission spectrum of which has a peak around 520 nm, and they may have a band of emission wavelength different from that of the other sets of LED elements 12. This point is the same for any other light-emitting apparatuses which will be described later.

The connection relation of the LED elements 12 may be different from that illustrated in FIG. 5 so long as the drive current can be independently supplied to each set. For example, one set of LED elements 12 may be connected to respective pairs of connection electrodes 17, or the number of connected sets of LED elements 12 may be different for the respective sets of connection electrodes 17. Further, the LED elements 12 may be mounted on the board 11 by flip-chip bonding using solder bumps, rather than by using the bonding wires 18.

The resin frame 13 is, for example, a circular frame body made of a white or colorless transparent resin, and is a dam member for preventing the sealing resin 14 from outflow. The resin frame 13 is fixed to the upper surface of the circuit board 11B in such a way as to surround the edge of the opening 111. Therefore, it can also be said that the LED elements 12 are mounted in a region on the mounting board 11A surrounded by the resin frame 13. The resin frame 13 reflects light emitted laterally from the LED elements 12 toward the upper side of the light-emitting apparatus 10, which side is opposite to the board 11 as seen from the LED elements 12.

The sealing resin 14 is, for example, a colorless and transparent resin, such as an epoxy resin and a silicone resin, containing a yellow phosphor 15 and a red phosphor 16 mixed and dispersed therein which are excited by light from the LED elements 12. The sealing resin 14 is filled in such a way as to bury the region surrounded by the resin frame 13 on the mounting board 11A, and is molded, for example, into a hemispherical shape, so that all the LED elements 12 on the board 11 are covered (sealed) integrally with a thickness different for the respective sets.

In the light-emitting apparatus 10, as illustrated in FIG. 2, the thickness of the sealing resin 14 increases from the outer peripheral portion near the resin frame 13 to the center of the board 11. Therefore, the thickness of the sealing resin 14 above the LED elements 12 is the same for the sets a1 and c2 on the outer peripheral portion, and it is larger for the sets a2 and c1 closer to the center of the board 11 and still larger for the sets b1 and b2, than for the sets a1 and c2. Thus, in the light-emitting apparatus 10, the thickness of the resin layer containing the yellow phosphor 15 and the red phosphor 16 immediately above the LED elements 12 is different for each of the sets of LED elements 12, and therefore, the chromaticity of light emitted from the sealing resin 14 differs when each of the sets of LED elements 12 emits light singly. As in the case of the sets a1 and c2, the thickness of the sealing resin 14 may be the same for some of the sets.

The yellow phosphor 15 is a particulate phosphor material that absorbs blue light from the LED elements 12 as excitation light and emits yellow fluorescence. For example, phosphors such as YAG (yttrium-aluminum-garnet)-based, delbium-based, strontium-based, phosphate-based, silicate-based, and aluminate-based ones are used for the yellow phosphor 15.

The red phosphor 16 is a particulate phosphor material that absorbs blue light from the LED elements 12 as excitation light and emits red light. For example, a phosphor of $CaAlSiN_3$ (calcium, aluminum, silicon tri-nitride) containing solid-solved $Eu^{2+}$ (europium) is used for the red phosphor 16.

As described above, in the light-emitting apparatus 10, the LED elements 12, which are blue LEDs, are covered with the sealing resin 14 containing the yellow phosphor 15 and the red phosphor 16 mixed therein. Thus, when the LED elements 12 emit light, the light-emitting apparatus 10 yields white light as a result of mixing of the blue light from the LED elements 12 and yellow and red lights generated by the yellow and red phosphors 15 and 16 excited by the blue light from the LED elements 12. Note that two or more phosphors may not be necessarily mixed in the sealing resin, and for example, two kinds of LEDs, i.e., blue LEDs and green LEDs may be used as the LED elements 12, with only one phosphor, i.e., red phosphor used.

The constant-current power supply 80 is connected to at least one of the pairs of connection electrodes 17a to 17c and supplies a drive current to a corresponding one of the multiple sets of LED elements 12. As a result, the color-matching apparatus 1 emits light having a chromaticity corresponding to this set of LED elements 12 through the sealing resin 14.

FIG. 6 is a table illustrating an example of a correspondence between chromaticity of emitted light and intensity of blue light included in the emitted light. The percentages of the yellow phosphor and that of the red phosphor are a weight ratio of the yellow phosphor 15 and that of the red phosphor 16 to the total amount of the phosphors contained in the sealing resin 14, respectively. The percentage of intensity in blue color is a ratio of the intensity of blue light having a wavelength of 450 nm to the intensity of the entire light emitted from the light-emitting apparatus 10. The chromaticity values are values on the x and y coordinates specified by CIE (Commission International de l'Eclairage). FIG. 6 illustrates a table which is made, for cases (1) to (6) respectively corresponding to different compounding ratios of the yellow phosphor 15 and the red phosphor 16, with light-emitting apparatuses 10, for example, prepared so as to have different thicknesses of the sealing resin 14, by measuring a ratio of the intensity of blue light (intensity in blue color) to that of the entire light emitted from each of the light-emitting apparatuses 10 and chromaticity of emitted light, under a fixed amount of drive current for the LED elements 12.

The magnitude of the intensity in blue color varies depending on the thickness of the sealing resin 14 covering the LED elements 12 emitting light and on the magnitude of the drive current for the LED elements 12. For example, when the thickness of the sealing resin 14 is constant, the intensity in blue color increases with the increase in the drive current for the LED elements 12, and conversely, the intensity in blue color decreases with the decrease in the drive current for the LED elements 12. Further, when the magnitude of the drive current is constant, excited light by the yellow phosphor 15 and the red phosphor 16 is less likely to be generated with the decrease in the thickness of the sealing resin 14, and therefore, the intensity in blue color increases, and conversely, the intensity in blue color decreases with the increase in the thickness of the sealing resin 14. Accordingly, switching a set of LED elements 12 driven to emit light in the light-emitting apparatus 10 corresponds to changing the intensity in blue color.

Figure 7:
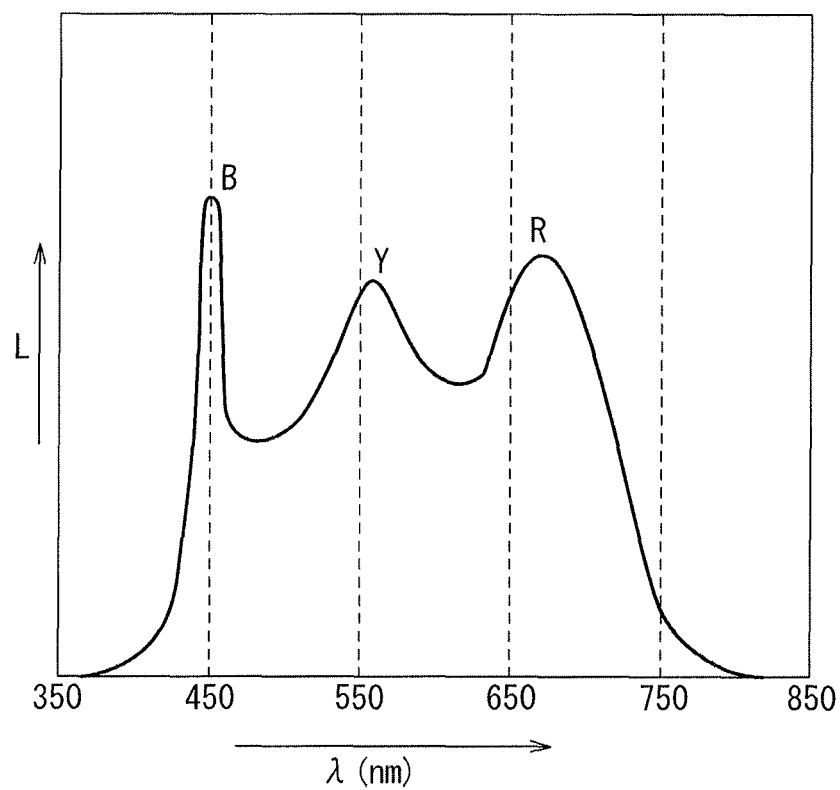
FIG. 7 is a graph illustrating an example of a spectrum of light emitted from the light-emitting apparatus 10.

FIG. 7 is a graph illustrating an example of a spectrum of light emitted from the light-emitting apparatus 10. The horizontal axis of the graph denotes wavelength $\lambda$ (nm), and the vertical axis denotes relative intensity L. In the light-emitting apparatus 10, peaks of relative intensity appear around wavelengths of 450 nm, 560 nm, and 670 nm in correspondence with blue light (B), yellow light (Y), and red light (R), generated by the LED elements 12, i.e., blue LEDs, the yellow phosphor 15, and the red phosphor 16. For this reason, in the light-emitting apparatus 10, the relative intensity of blue light having a wavelength of 450 nm is used as the intensity in blue color.

Figure 8:
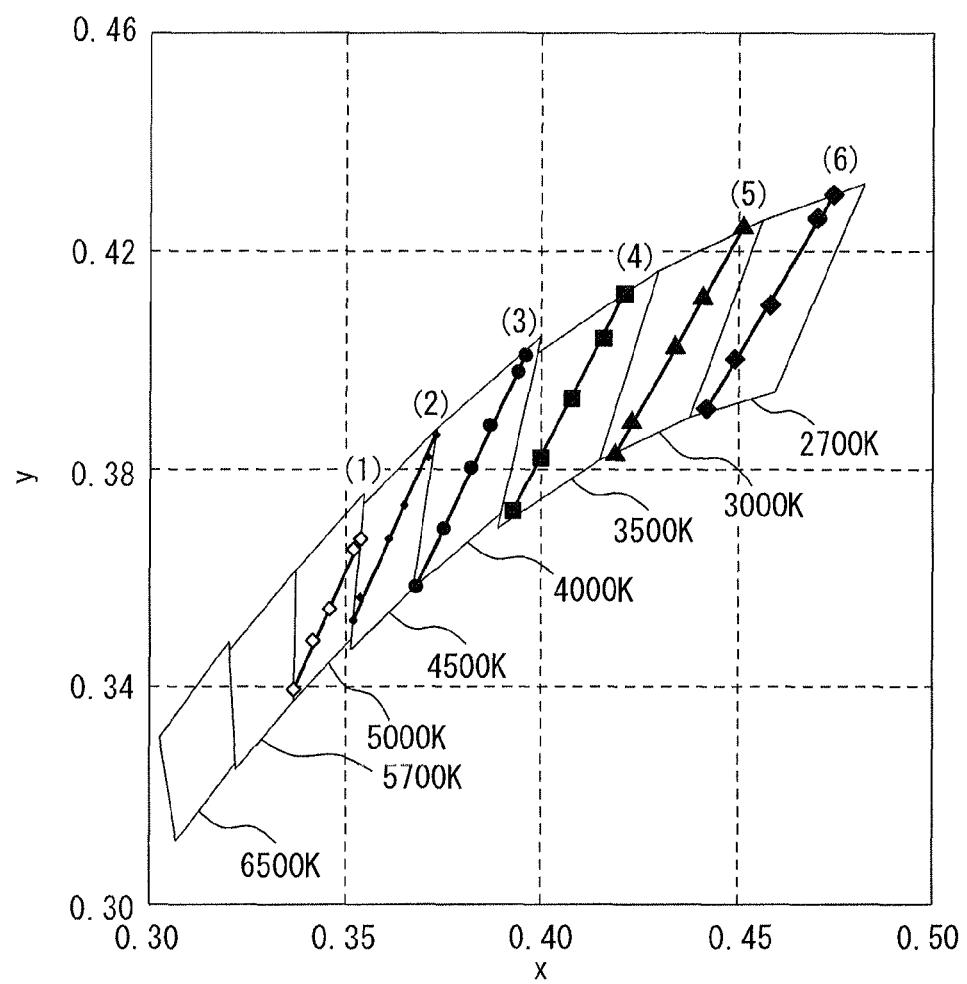
FIG. 8 is a chromaticity diagram corresponding to FIG. 6.

FIG. 8 is a chromaticity diagram corresponding to FIG. 6. The horizontal axis of the graph denotes the x coordinate of chromaticity, and the vertical axis denotes the y coordinate thereof. Six linear lines denoted by (1) to (6) are loci of chromaticity drawn when the intensity in blue color is changed for respective compounding ratios listed in FIG. 6, and points indicated by circular or square symbols on the lines correspond to the chromaticity values listed in FIG. 6. Further, eight quadrangles in the graph indicate classifications of white light (2,700 K to 6,500 K) based on Correlated Color Temperatures (CCTs) specified by the ANSI (American National Standard Institute) C78.377 standard.

When the intensity in blue color is changed by switching a set of LED elements 12 driven to emit light, the chromaticity of the emitted light varies, on the chromaticity diagram of FIG. 8, following a different linear locus depending on the compounding ratio of the yellow phosphor 15 and the red phosphor 16. In this instance, values of the chromaticity move to the upper right of the graph with the increase in the intensity in blue color, and to the lower left of the graph with the decrease in the intensity in blue color. Particularly, when the compounding ratio of the phosphors is set to any one of (1) to (6) in FIG. 6 and the intensity in blue color is varied within the ranges listed in FIG. 6, the locus of the chromaticity passes through the center coordinate of any one of Correlated Color Temperatures (CCTs) specified by ANSI 2011 and extends approximately from the lower left to the upper right of the quadrangular region corresponding to the one of the color temperatures. Therefore, the adjustment of the intensity in blue color enables the adjustment of the chromaticity of the emitted light from the light-emitting apparatus 10 along a linear line illustrated in FIG. 8 within any one of the quadrangular regions (1) to (6) corresponding to a compounding ratio of the phosphors.

In particular, the differences between x and y coordinates of each point on the six linear lines denoted by (1) to (6) in FIG. 8 and those of the center point of each of the Correlate Color Temperatures (CCTs) are within ±2% of the values of the x and y coordinates of the center point. Therefore, the chromaticity of emitted light can be adjusted within the range of ±2% around the center point of each Correlated Color Temperature (CCT), by using blue LEDs as the LED elements 12, setting the compounding ratio of the phosphors to any one of (1) to (6) in FIG. 6, and determining the thickness of the sealing resin 14 at a position where each set of LED elements 12 is mounted so that the intensity in blue color has a value within the range illustrated in FIG. 6.

The slope of the linear lines which are loci of chromaticity is determined by the emission wavelength of the LED elements 12. Since only blue LEDs are used as the LED elements 12 in the light-emitting apparatus 10, the range within which the chromaticity can be adjusted is limited on one linear line in the chromaticity diagram. However, for example, when blue LEDs are used for some sets of LED elements 12 connected in series and green LEDs are used for the other sets of LED elements 12, the chromaticity of emitted light is varied along a linear line having a slope different from that illustrated in FIG. 8 by varying the intensity in green color (intensity ratio of the green light to the entire emitted light). Therefore, when two kinds of LEDs, i.e., blue LEDs and green LEDs are used as the LED elements 12, the chromaticity can be adjusted within a two-dimensional region on the chromaticity diagram by varying both the intensity in blue color and that in green color.

Figure 9:
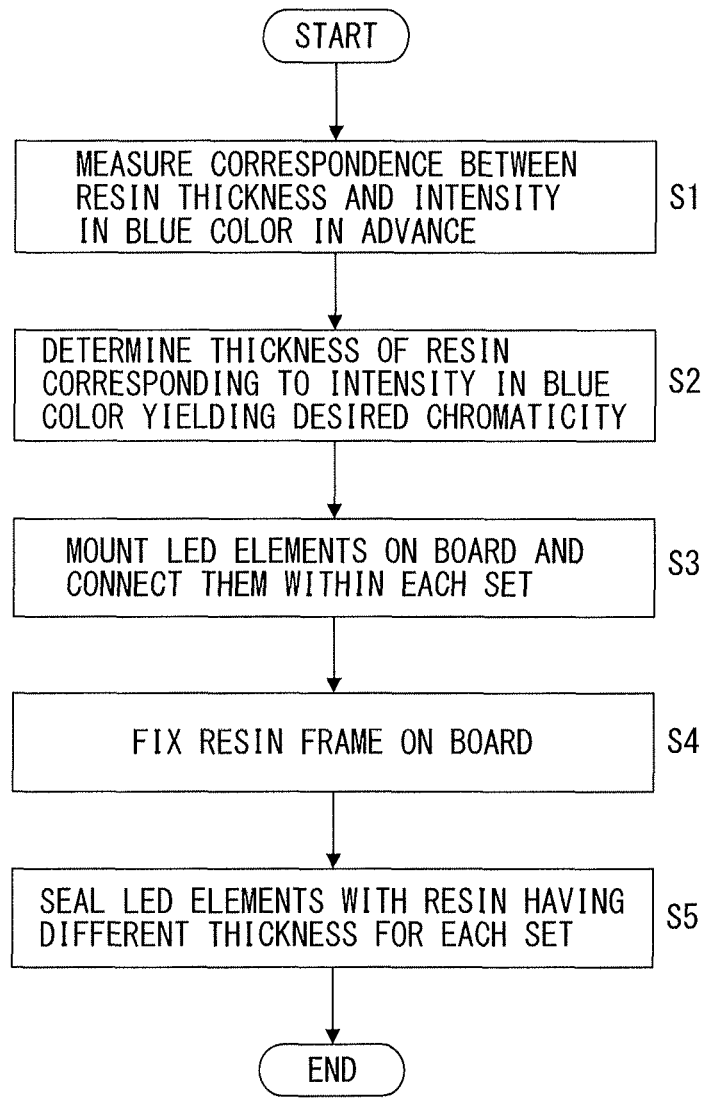
FIG. 9 is a flowchart illustrating an example of production steps of the light-emitting apparatus 10.
Figure 10:
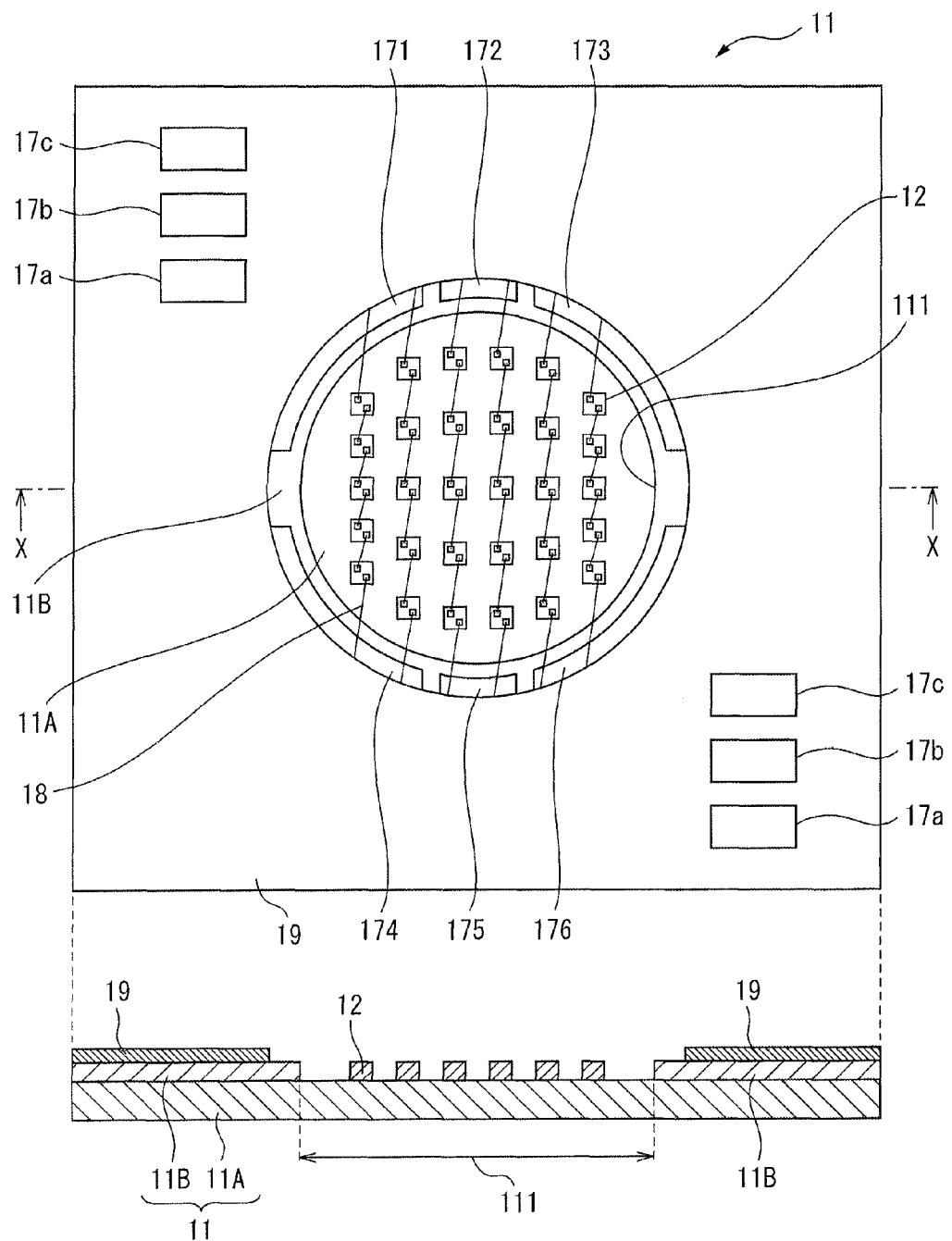
FIG. 10 is a combination of a top view and a vertical cross-sectional view for explaining the production steps of the light-emitting apparatus 10.
Figure 11:
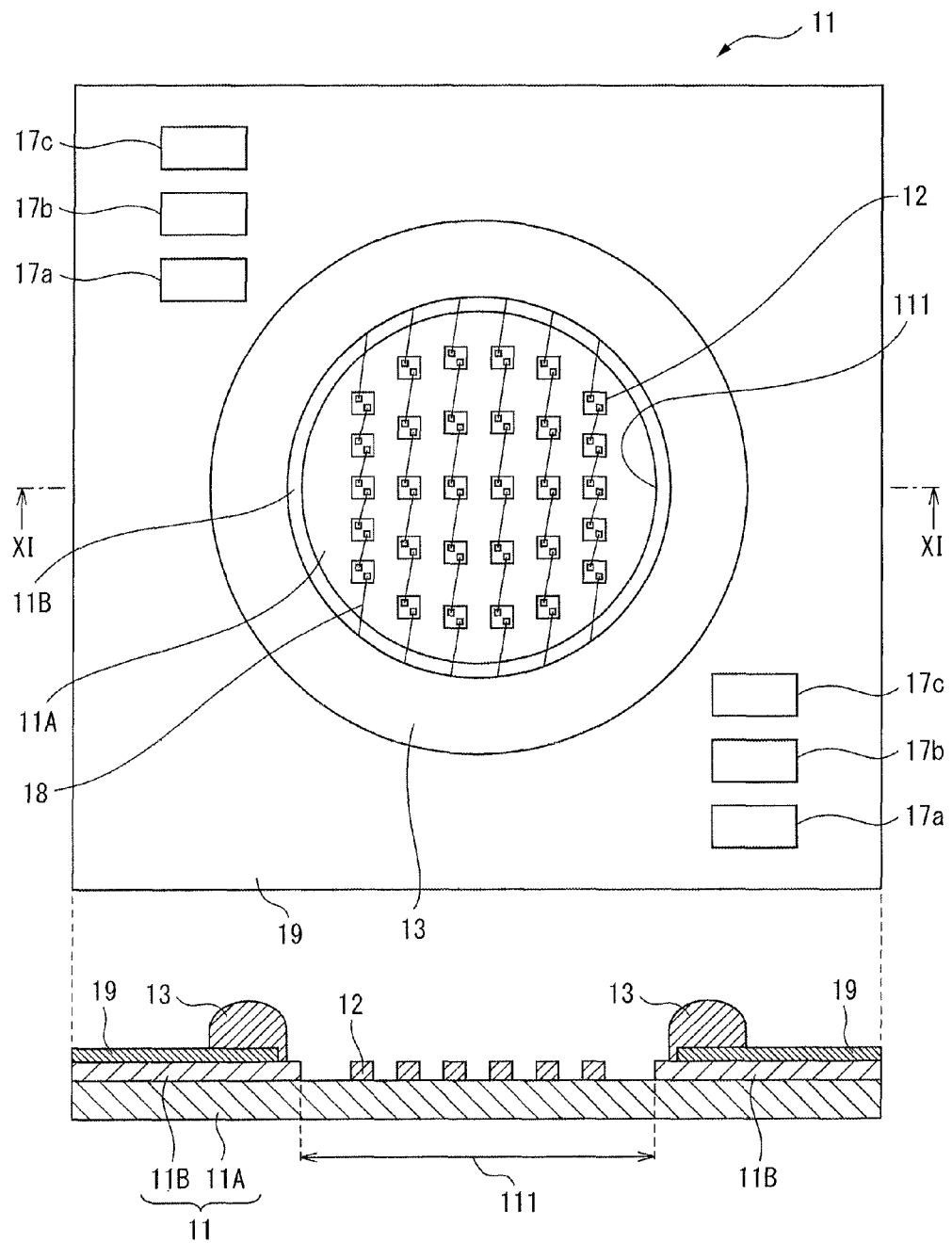
FIG. 11 is a combination of a top view and a vertical cross-sectional view for explaining the production steps of the light-emitting apparatus 10.

FIG. 9 is a flowchart illustrating an example of production steps of the light-emitting apparatus 10. FIGS. 10 and 11 are combinations of a top view and a vertical cross-sectional view for explaining the production steps of the light-emitting apparatus 10. The cross-sectional view of FIG. 10 illustrates a cross-section of the board 11 along the X-X line in the top view of FIG. 10, and the cross-sectional view of FIG. 11 also illustrates a cross-section of the board 11 along the XI-XI line in the top view of FIG. 11.

In order to produce the light-emitting apparatus 10, a plurality of COB light-emitting apparatuses are first prepared which include blue LEDs sealed by a sealing resin which has a different resin thickness for each of the apparatuses and the same compounding ratio of a yellow phosphor and a red phosphor. These light-emitting apparatuses are driven with the constant-current power supply 80, and the relative intensity of blue light having a wavelength 450 nm is measured as an intensity in blue color, to determine in advance the correspondence between the resin thickness and the intensity in blue color (S1). Then, the resin thickness corresponding to the intensity in blue color yielding a desired chromaticity is determined with reference to the correspondence obtained in S1 and the correspondence illustrated in FIG. 6 and FIG. 8 (S2). In other words, for each of the sets of LED elements 12, the thickness of the sealing resin 14 is determined so that the x and y coordinates of a chromaticity value of emitted light may fall within the range of ±2% around the center point of each of the Correlated Color Temperatures (CCTs).

Then, as illustrated in FIG. 10, multiple LED elements 12 are mounted in a circular region of the mounting board 11A exposed in the opening 111, and the LED elements 12 are electrically connected to each other, by bonding wires 18, within each set to which drive current is supplied independently (S3). In the illustrated example, thirty LED elements 12 are mounted, respective five elements among which are connected in series, and the six rows of LED elements 12 are connected between a pair of conductive patterns 171 and 174, a pair of conductive patterns 172 and 175, or a pair of conductive patterns 173 and 176.

Next, as illustrated in FIG. 11, the circular resin frame 13 is fixed to the upper surface of the circuit board 11B in such a way as to surround the edge of the opening 111 (S4). Then, the sealing resin 14 containing a yellow phosphor 15 and a red phosphor 16 mixed therein at a specified compounding ratio is filled so as to bury the region on the mounting board 11A surrounded by the resin frame 13, to seal respective sets of LED elements 12 with respective thicknesses determined in S2 (S5). Through the steps described above, the light-emitting apparatus 10 illustrated in FIGS. 1 and 2 is obtained.

FIG. 12 is a table illustrating another example of the correspondence between the chromaticity of emitted light and the intensity in blue color included in the emitted light. The phosphors mixed in the sealing resin 14 are not limited to the yellow phosphor and the red phosphor, and other combinations may be used. FIG. 12 illustrates an example of the correspondence between the chromaticity of emitted light and the intensity of blue light included in the emitted light, made as in the case of the table in FIG. 6, by using a green phosphor in place of the yellow phosphor, with compounding ratios of the green phosphor and the red phosphor changed as listed in (1) to (6). The green phosphor is a particulate phosphor material such as $(BaSr)_2 SiO_4:Eu^{2+}$, which absorbs blue light from the LED elements 12 as excitation light and emits green light. The percentages of the green phosphor and the red phosphor are weight ratios of the green phosphor and the red phosphor to the total phosphors contained in the sealing resin 14, respectively. The definition of the values of the intensity in blue color and the chromaticity is the same as in FIG. 6.

Figure 13:
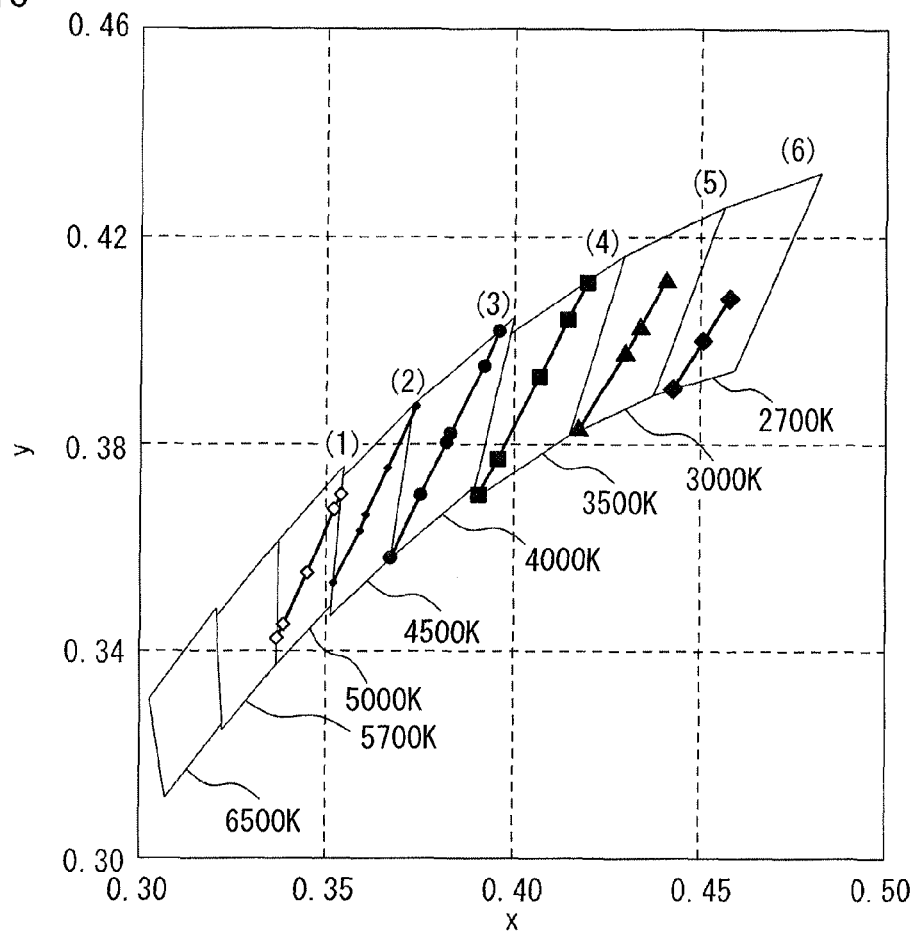
FIG. 13 is a chromaticity diagram corresponding to FIG. 12.

FIG. 13 is a chromaticity diagram corresponding to FIG. 12. The horizontal axis of the graph denotes the x coordinate of chromaticity, and the vertical axis denotes the y coordinate thereof. Six linear lines denoted by (1) to (6) are loci of chromaticity drawn when the intensity in blue color is changed for respective compounding ratios listed in FIG. 12, and points indicated by circular or square symbols on the lines correspond to the chromaticity values listed in FIG. 12. Further, twelve quadrangles in the graph indicate classifications of white light (2,700 K to 6,500 K) based on Correlated Color Temperatures (CCTs) specified by the ANSI (American National Standard Institute) C78.377 standard.

Even in this case that the green phosphor is used in place of the yellow phosphor, when the intensity in blue color is changed by switching a set of LED elements 12 driven to emit light, the chromaticity of the emitted light varies, on the chromaticity diagram of FIG. 13, following a different linear locus depending on the compounding ratio of the green phosphor and the red phosphor, as in the case of FIG. 8. In the case that the compounding ratio of the phosphors is any one of (1) to (4), when the intensity in blue color is varied within the ranges listed in FIG. 12, the locus of the chromaticity passes through the center coordinate of any one of Correlated Color Temperatures (CCTs) specified by ANSI 2011 and extends approximately from the lower left to the upper right of the quadrangular region corresponding to the one of the color temperatures. However, when the green phosphor is used, the chromaticity locus spreads only within a limited range from the center of a quadrangular region of 3,000 K or 2,700 K to the lower left thereof in the case that the compounding ratio of the phosphors is (5) or (6) in FIG. 12. Therefore, the light-emitting apparatus using green phosphor and red phosphor enables adjusting the chromaticity of emitted light along the linear line illustrated in FIG. 13 within the range of any one of the quadrangular regions (1) to (6) corresponding to a compounding ratio of the phosphors.

Figure 14:
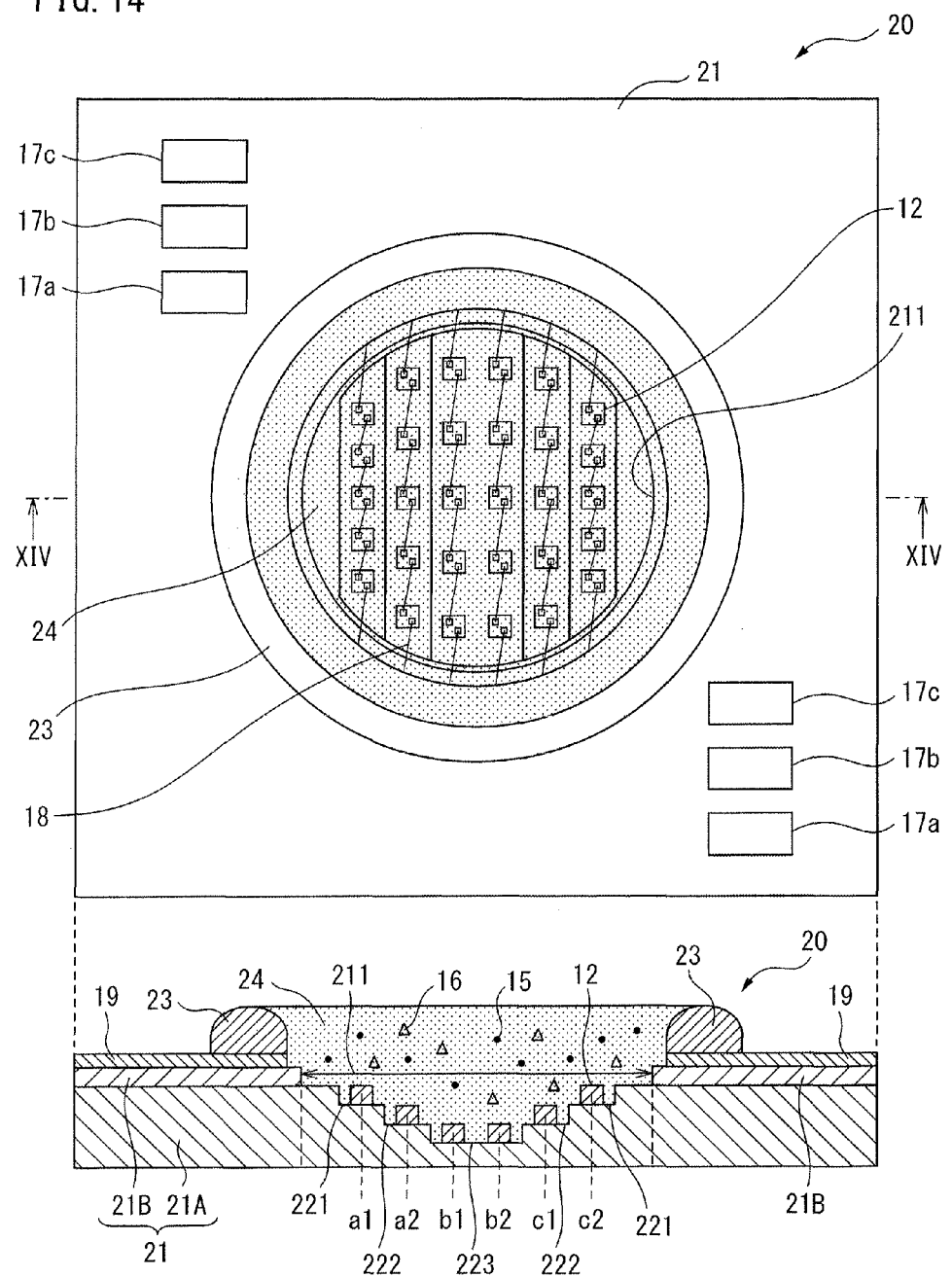
FIG. 14 is a combination of a top view and a vertical cross-sectional view of another light-emitting apparatus 20.

FIG. 14 is a combination of a top view and a vertical cross-sectional view of another light-emitting apparatus 20. The cross-sectional view of FIG. 14 illustrates a cross-section of the light-emitting apparatus 20 along the XIV-XIV line in the top view of FIG. 14. The light-emitting apparatus 20 includes a board 21, LED elements 12, a resin frame 23, and a sealing resin 24 containing a yellow phosphor 15 and a red phosphor 16 mixed therein. The configuration of the light-emitting apparatus 20 is the same as that of the light-emitting apparatus 10, except for the shapes of the board 21 and the sealing resin 24.

The board 21 is configured by a mounting board 21A and a circuit board 21B. The mounting board 21A is a rectangular metal board made of aluminum among others. The circuit board 21B is a rectangular insulating board having a uniform thickness, and it has a circular opening 211 and is fixed to the upper surface of the mounting board 21A. The circuit board 21B is the same as the circuit board 11B of the light-emitting apparatus 10, but the mounting board 21A, unlike the mounting board 11A, has horizontal planes the heights of which in the vertical direction are different from each other due to steps formed on the upper surface of a portion exposed in the opening 211. FIG. 14 illustrates an example in which horizontal planes 221 to 223 are formed into three steps and has three different heights.

The LED elements 12 of the light-emitting apparatus 20 are mounted in regions of different heights on the upper surface of the mounting board 21A exposed in the opening 211. For example, the light-emitting apparatus 20 also has six sets of five LED elements 12, which include thirty LED elements 12 in total, and LED elements 12 connected in series within each of the sets are disposed on a horizontal plane of the mounting board 21A having the same height. More precisely, two sets of LED elements 12 denoted by reference numerals a1 and c2 are disposed on the horizontal planes 221 on the right side and the left side of the cross-sectional view of FIG. 14. Further, two sets of LED elements 12 denoted by reference numerals a2 and c1 are disposed on the two horizontal planes 222 which are one step lower than the horizontal planes 221 and located closer to the center of the figure. Still further, two sets of LED elements 12 denoted by reference numerals b1 and b2 are disposed on the lowest horizontal plane 223 in the center of the figure.

As illustrated in FIG. 2, in the light-emitting apparatus 10, the upward protrusion of the sealing resin 14 becomes higher in the center than in the outer peripheral portion near the resin frame 13, and thereby, the thickness of the sealing resin 14 is varied for each of the sets of LED elements 12. On the other hand, in the light-emitting apparatus 20, as illustrated in FIG. 14, the board 21 has the steps which become lower in the center than in the outer peripheral portion, and the upper surface of the sealing resin 24 forms one horizontal plane. In this way, the thickness of the board 21 may be changed in a stepwise manner, so that the respective sets a1 to c2 of LED elements 12 are mounted at different heights and connected so as to be driven independently. Further, the LED elements 12 may be sealed in such a way that the upper surface of the sealing resin 24 is horizontally flat, so that the thickness immediately above the LED elements 12 of the sealing resin 14 is changed for each of the sets of LED elements 12.

Figure 15:
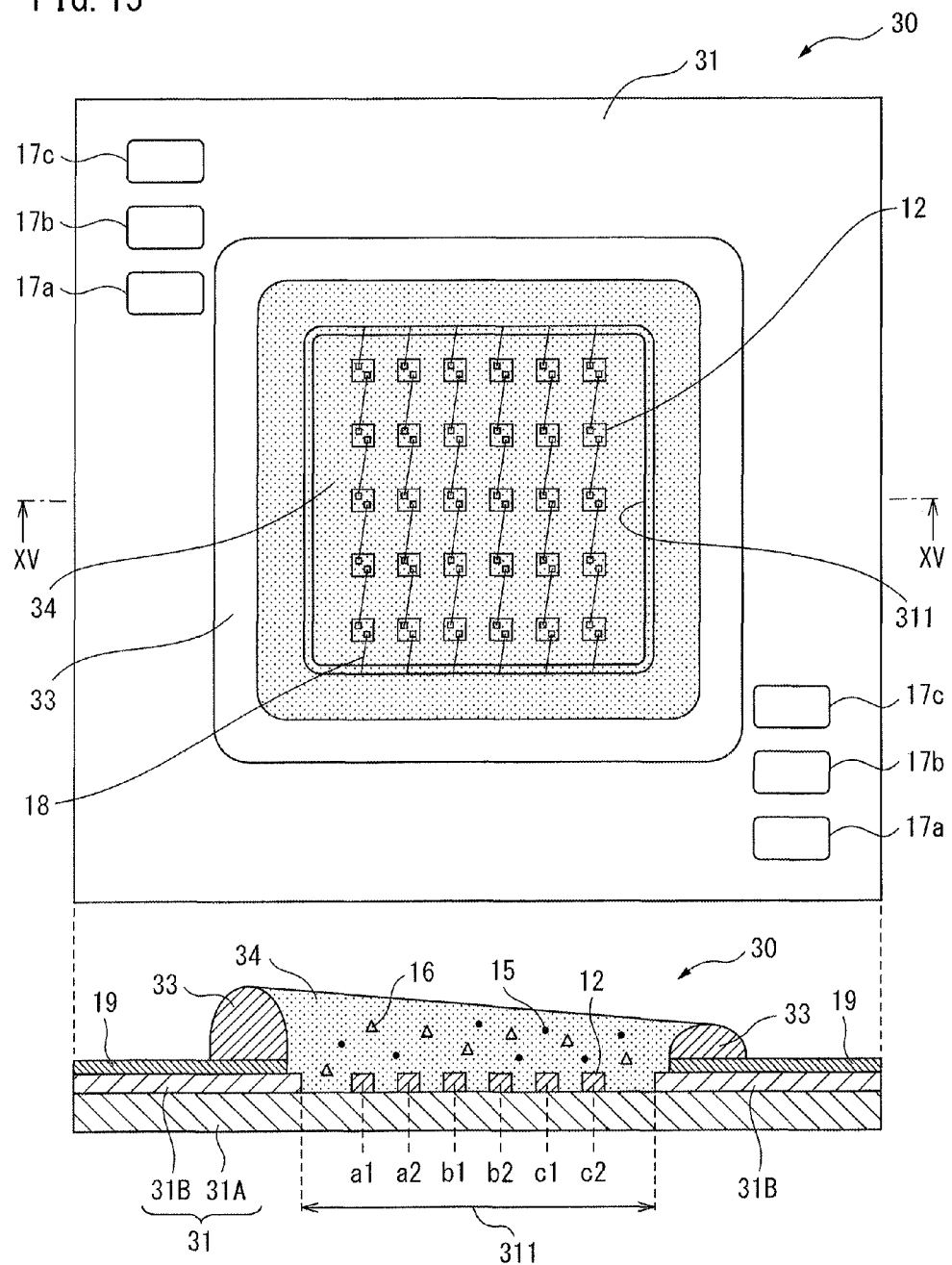
FIG. 15 is a combination of a top view and a vertical cross-sectional view of yet another light-emitting apparatus 30.

FIG. 15 is a combination of a top view and a vertical cross-sectional view of yet another light-emitting apparatus 30. The cross-sectional view of FIG. 15 illustrates a cross-section of the light-emitting apparatus 30 along the XV-XV line in the top view of FIG. 15. The light-emitting apparatus 30 includes a board 31, LED elements 12, a resin frame 33, and a sealing resin 34 containing a yellow phosphor 15 and a red phosphor 16 mixed therein. The configuration of the light-emitting apparatus 30 is the same as that of the light-emitting apparatus 10, except for the shapes of the board 31, the resin frame 33, and the sealing resin 34.

As illustrated in FIG. 15, the resin frame 33 is a rectangular frame in the light-emitting apparatus 30. The board 31 is configured by a mounting board 31A and a circuit board 31B, and this configuration is the same as that of the mounting board 11A and the circuit board 11B of the light-emitting apparatus 10 except that an opening 311 of the circuit board 31B is rectangular in correspondence to the resin frame 33. Further, the sealing resin 34 is filled in such a way as to bury the region on the mounting board 31A surrounded by the resin frame 33, and has a rectangular shape as seen from above.

In the light-emitting apparatus 30, five sets of LED elements 12 denoted by reference numerals a1 to c2 are mounted on the horizontal mounting surface of the mounting board 31A, and the height of the resin frame 33 from the mounting surface is higher on the left side than on the right side in the drawing. In other words, the height of the resin frame 33 from the mounting surface may gradually decrease from one side (the left side in the drawing) of the board 31 toward the other side of the board 31 opposed thereto (the right side in the drawing). In addition, the thickness of the sealing resin 34 on the left side of the drawing is the largest and decreases toward the right side of the drawing, so that the upper surface of the sealing resin 34 is sloping. In other words, the sealing resin 34 seals the multiple sets of LED elements 12 so that the thickness of the resin gradually decreases from one side of the board 31 to the other side of the board 31 opposed thereto. In this manner, the thickness of the sealing resin immediately above the LED elements 12 may be varied for the respective independently drivable sets of LED elements 12.

Figure 16:
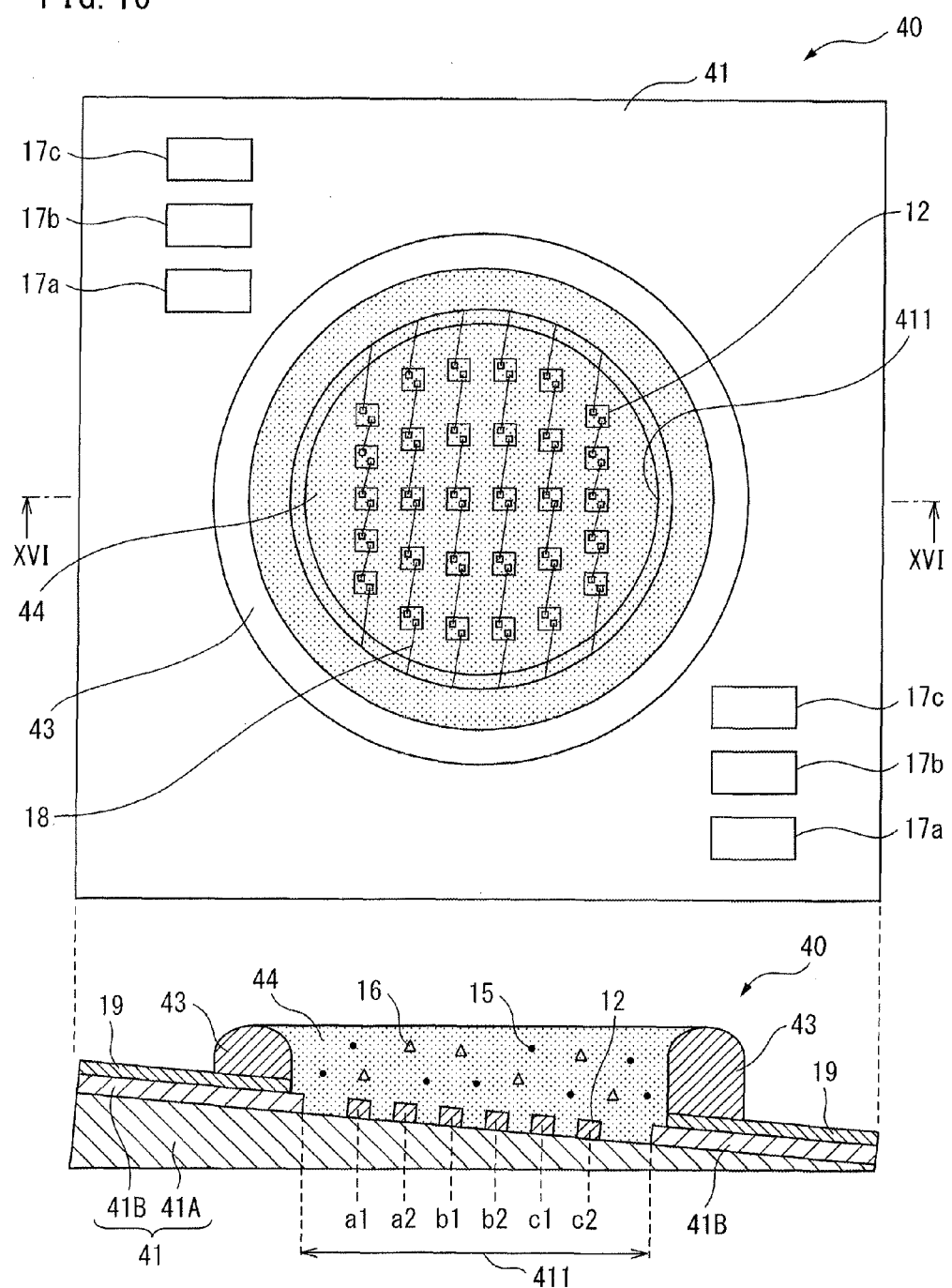
FIG. 16 is a combination of a top view and a vertical cross-sectional view of still another light-emitting apparatus 40.

FIG. 16 is a combination of a top view and a vertical cross-sectional view of still another light-emitting apparatus 40. The cross-sectional view of FIG. 16 illustrates a cross-section of the light-emitting apparatus 40 along the XVI-XVI line in the top view of FIG. 16. The light-emitting apparatus 40 includes a board 41, LED elements 12, a resin frame 43, and a sealing resin 44 containing a yellow phosphor 15 and a red phosphor 16 mixed therein. The configuration of the light-emitting apparatus 40 is the same as that of the light-emitting apparatus 10, except for the shapes of the board 41, the resin frame 43, and the sealing resin 44.

The board 41 is configured by a mounting board 41A and a circuit board 41B. The mounting board 41A is a rectangular metal board made of aluminum among others. The circuit board 41B is a rectangular insulating board having a uniform thickness, and it has a circular opening 411 and is fixed to the upper surface of the mounting board 41A. The circuit board 41B is the same as the circuit board 11B of the light-emitting apparatus 10, but as illustrated in FIG. 16, the upper surface of the mounting board 41A, which is a mounting surface of the LED elements 12, is sloping with respect to the horizontal plane due to lowering of the right side in the drawing, unlike the mounting board 11A. The LED elements 12 of the light-emitting apparatus 40 are mounted on the upper surface (sloping surface) of the mounting board 41A exposed in the opening 411.

The resin frame 43 is a circular frame like the resin frame 13, but the height of the resin frame 43 from the mounting surface is larger at a position where the height of the mounting surface is lower with respect to a horizontal plane, so that the upper end of the resin frame 43 is positioned on an identical horizontal plane throughout the circumference of the frame. The sealing resin 44 is molded so that its lower end spreads along the sloping mounting surface of the board 41 and its upper end forms one horizontal plane. In the light-emitting apparatus 40, the sealing of the LED elements 12 in this manner results in the increase in the thickness of the sealing resin 44 from the left side toward the right side in the drawing. In this manner, the thickness of the sealing resin 44 immediately above the LED elements 12 may be varied for the respective independently drivable sets of LED elements 12.

FIGS. 17 to 20 are vertical cross-sectional views of still other light-emitting apparatuses 10' to 40'. Each of the light-emitting apparatuses 10' to 40' has the same configuration as the above-described light-emitting apparatuses 10 to 40 except for the configuration of their board. All of the boards 11' to 41' of the light-emitting apparatuses 10' to 40' are single ceramic boards, rather than boards configured by a mounting board and a circuit board bonded thereto. Each of the boards 11' to 41' is a flat board including not only conductive patterns and connection electrodes formed on the upper surface of the board which are each similar to the conductive patterns 171 to 176 and the connection electrodes 17 described above, but also LED elements 12 mounted thereon, and the boards function as not only a mounting board but also a circuit board. In this manner, a ceramic board having no opening portion may be used for the board of the light-emitting apparatuses.

Figure 17:
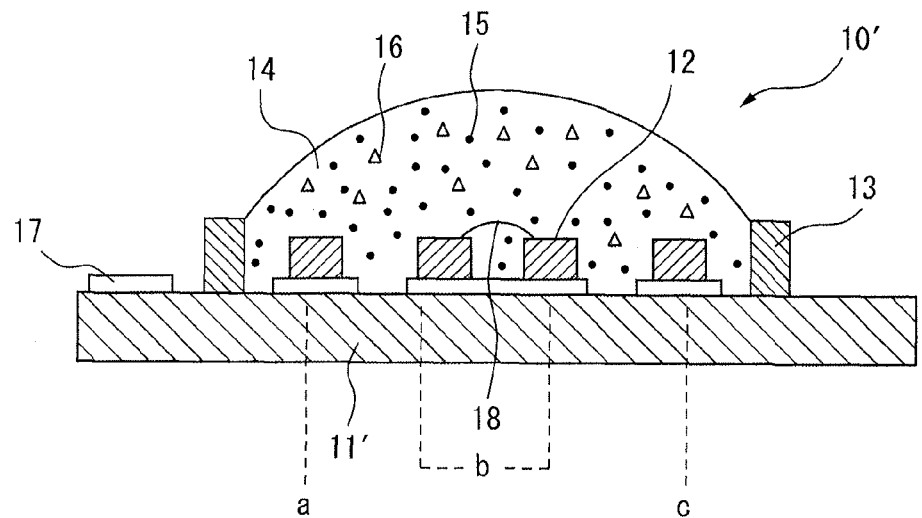
FIG. 17 is a vertical cross-sectional view of still other light-emitting apparatus 10'.
Figure 18:
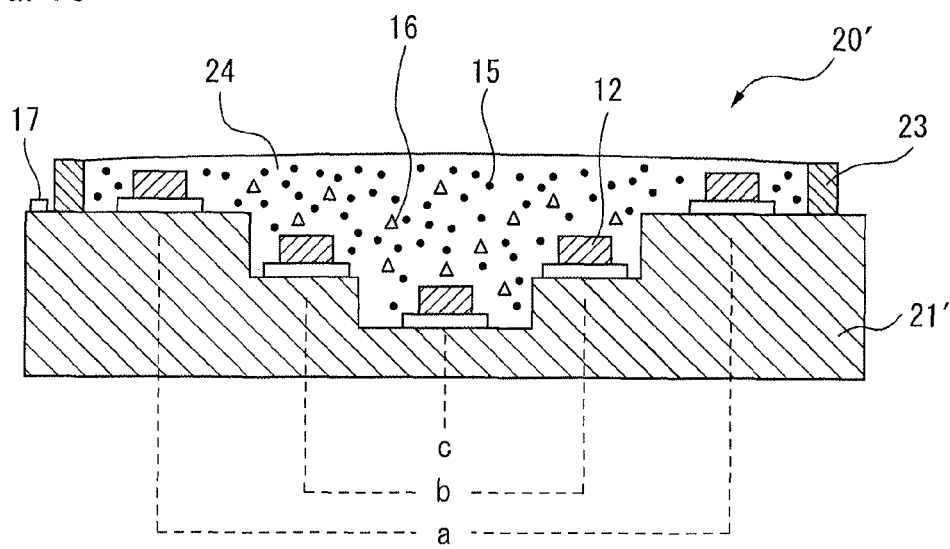
FIG. 18 is a vertical cross-sectional view of still other light-emitting apparatus 20'.
Figure 19:
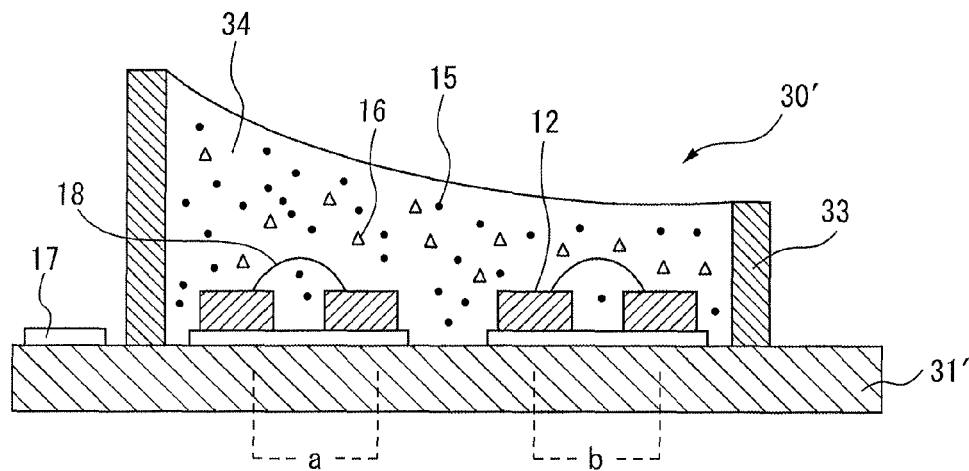
FIG. 19 is a vertical cross-sectional view of still other light-emitting apparatus 30'.
Figure 20:
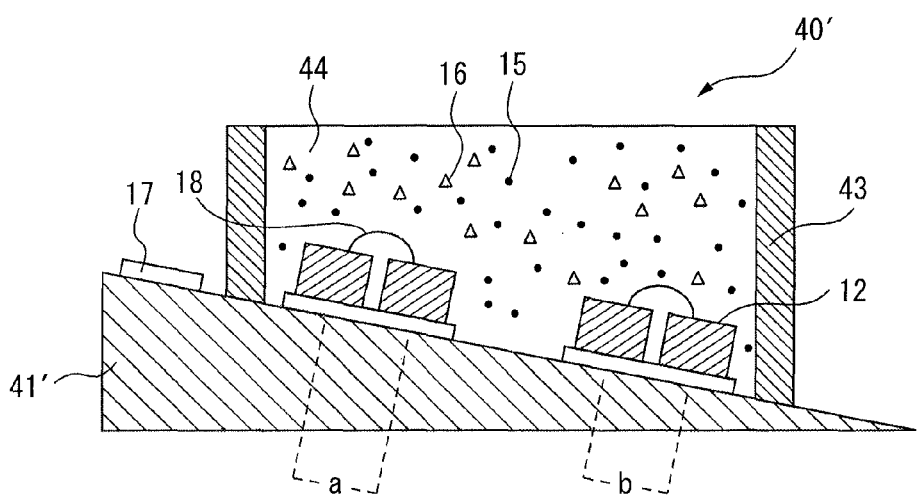
FIG. 20 is a vertical cross-sectional view of still other light-emitting apparatus 40'.

In addition, in the light-emitting apparatuses 10' and 20', the LED elements 12 are divided into three sets denoted by reference numerals a to c in FIGS. 17 and 18, and the respective sets, separately connected to three pairs of connection electrodes 17, can be driven independently. In the light-emitting apparatuses 30' and 40', the LED elements 12 are divided into two sets denoted by reference numerals a and b in FIGS. 19 and 20, and the respective sets, separately connected to two pairs of connection electrodes 17, can be driven independently. In this manner, any number of sets of LED elements 12 may be used as long as the number of the sets is two or more, and the total number of mounted LED elements 12 may also be any number. Further, the number of the pairs of connection electrodes 17 may be any number as long as the number is two or more.

As described above, in the light-emitting apparatus 10 (or the light-emitting apparatuses 20 to 40, and 10' to 40'), the thickness of the sealing resin 14 (the sealing resins 24 to 44) is different for respective independently driven sets of LED elements 12, and a set of LED elements 12 emitting light is switched according to a desired chromaticity. Thus, the color-matching apparatus 1 enables actualization of a color mixing function of changing the chromaticity of a light-emitting apparatus (LED package) within a range of an identical color temperature specified by ANSI 2011. In addition, the light-emitting apparatuses 10 to 40 and 10' to 40' having such a color mixing function also enables correction of chromaticity shift caused by temperature variation. Accordingly, the light-emitting apparatuses 10 to 40 and 10' to 40' enables elimination of design which takes into account chromaticity shift caused by temperature variation, and therefore, their manufacturing process can be simplified.

Figure 21:
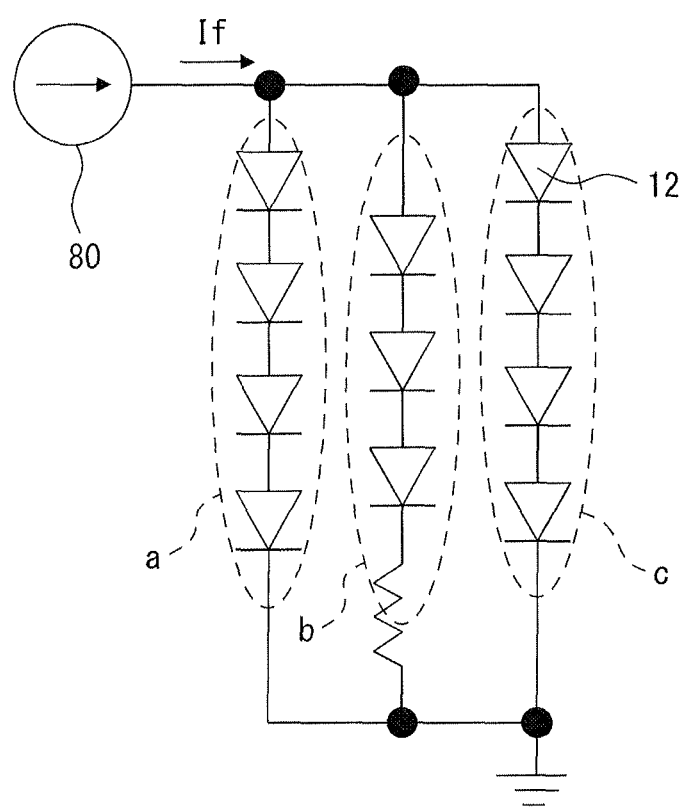
FIG. 21 is a diagram illustrating another example of the connection relation of the LED elements 12.
Figure 22:
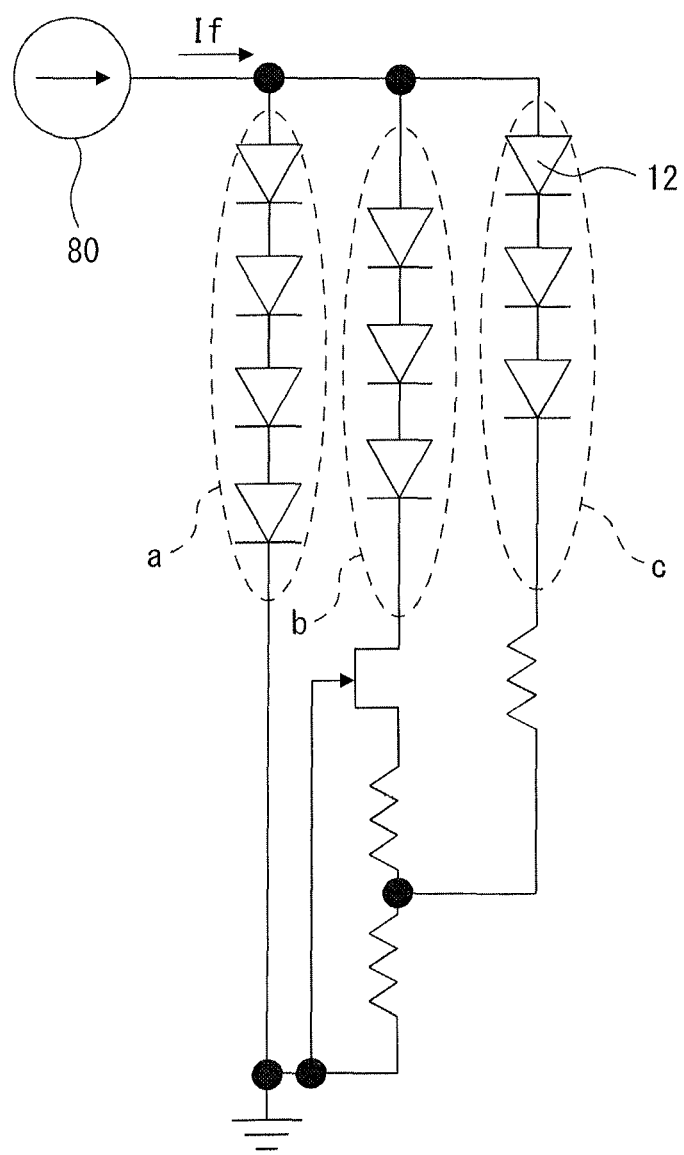
FIG. 22 is a diagram illustrating another example of the connection relation of the LED elements 12.

FIGS. 21 and 22 are diagrams illustrating other examples of the connection relation of the LED elements 12. These figures illustrate examples in which three or four LED elements 12 connected in series are used as a set, and three sets of LED elements 12 denoted by reference numerals a to c are connected in parallel. Reference numerals a and c denote sets of LED elements 12 mounted in a region where the thickness of the sealing resin is relatively thin, and reference numeral b denotes a set of LED elements 12 mounted in another region where the thickness of the sealing resin is thicker than that in the region corresponding to reference numerals a and c. The LED elements 12 in the light-emitting apparatus 10 described above may be connected to a constant-current power supply 80, as illustrated in FIG. 21 or FIG. 22.

In FIG. 21, each of the sets denoted by reference numerals a and c is configured by four LED elements 12. On the other hand, in the set denoted by reference numeral b, the number of the LED elements 12 is three, smaller by one, and a resistor is connected in series to this set of LED elements 12 instead. In the example of FIG. 21, one or more sets of LED elements 12 denoted by reference numerals a to c are driven according to the amount of a current If from the constant-current power supply 80 (variable constant-current circuit).

In FIG. 22, the set denoted by reference numeral a is configured by four LED elements 12. The set denoted by reference numeral b is configured by three LED elements 12, and a depletion-type FET and a resistor are connected in series to this set of LED elements 12. The set denoted by reference numeral c is configured by three LED elements 12, and a resistor is connected in series to this set of LED element 12. Further, also in the example of FIG. 22, one or more sets of LED elements 12 denoted by reference numerals a to c are driven according to the amount of the current If from the constant-current power supply 80 (variable constant current circuit).

In addition, in the light-emitting apparatuses 20 to 40 and 10' to 40' described above, the sets of LED elements 12 mounted in a region where the thickness of the sealing resin is relatively thin may be connected to the sets of LED elements 12 mounted in a region where the thickness of the sealing resin is relatively thick, as illustrated in FIG. 21 or FIG. 22.

The preceding description is merely to illustrate and describe exemplary embodiments of the present invention. It is not intended to be exhaustive or limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, the invention is not limited to the particular embodiment disclosed as the best mode contemplated for carrying out this invention, but the invention includes all embodiments falling within the scope of the claims. The invention may be practiced otherwise than is specifically explained and illustrated without departing from its spirit or scope.

What is claimed is:

1. A light-emitting apparatus comprising:
a board;
a resin frame fixed on the board;
a plurality of sets of light-emitting elements which are mounted in a region on the board surrounded by the resin frame, wherein the light-emitting elements configuring each of the sets are connected in series to each other;
a plurality of pairs of connection electrodes which are provided on the board, and electrically connected to the plurality of sets of light-emitting elements and capable of supplying a drive current selectively to some of the plurality of sets of light-emitting elements; and
a sealing resin which comprises a phosphor mixed therein and excited by light from the plurality of sets of light-emitting elements, and is filled in such a way as to bury the region on the board surrounded by the resin frame, to seal integrally the plurality of sets of light-emitting elements with a single sealing resin,
wherein a thickness of the sealing resin immediately above the plurality of sets of light-emitting elements differs for the respective sets, and thereby, a chromaticity of light emitted from the sealing resin differs when each of the sets of light-emitting elements emits the light singly,
wherein the light-emitting elements within each of the sets are placed at the same depth from an upper surface of the sealing resin, and the light-emitting elements of different sets are placed at different depths from the upper surface of the sealing resin.

2. The light-emitting apparatus according to claim 1, wherein the thickness of the sealing resin in a location where the plurality of sets of light-emitting elements are mounted is determined so that a chromaticity value of the emitted light may fall within a range of ±2% around a chromaticity value of a center point of a region on a chromaticity diagram corresponding to one of a plurality of white colors classified based on Correlated Color Temperatures according to the ANSI C78.377 standard.

3. The light-emitting apparatus according to claim 1, wherein
the plurality of sets of light-emitting elements are mounted on a horizontal mounting surface of the board,
a height of the resin frame from the mounting surface gradually decreases from one side of the board to the other side of the board opposed to the one side, and
the sealing resin seals the plurality of sets of light-emitting elements so that the thickness of the sealing resin may gradually decrease from the one side to the other side.

4. The light-emitting apparatus according to claim 1, wherein
the board comprises a mounting surface sloping with respect to a horizontal plane,
the plurality of sets of light-emitting elements are mounted on the sloping mounting surface,
a height of the resin frame from the mounting surface increases with decrease in a height of the mounting surface from the horizontal plane, so that an upper end of the resin frame is kept positioned on an identical horizontal plane throughout a circumference of the resin frame, and
an upper end of the sealing resin is on the identical horizontal plane.

5. The light-emitting apparatus according to claim 4, wherein the board is configured by a metal mounting board an upper surface of which is the sloping mounting surface and a circuit board having a uniform thickness and an opening, the circuit board being fixed to the upper surface of the mounting board and comprising the plurality of pairs of connection electrodes formed thereon, and
the plurality of sets of light-emitting elements are mounted on the upper surface of the mounting board exposed in the opening.

6. The light-emitting apparatus according to claim 1, wherein
the board comprises a plurality of horizontal planes having a different height in a vertical direction due to steps formed on an upper surface of the board,
each of the sets of light-emitting elements is mounted in a location on the different height, and
an upper end of the sealing resin is on an identical horizontal plane.

7. The light-emitting apparatus according to claim 6, wherein
the board is configured by a metal mounting board and a circuit board, the metal mounting board having the plurality of horizontal planes, and the circuit board having a uniform thickness and an opening, being fixed to an upper surface of the mounting board, and comprising the plurality of pairs of connection electrodes formed thereon, and
the plurality of sets of light-emitting elements are mounted on the upper surface of the mounting board exposed in the opening.

8. The light-emitting apparatus according to claim 1, wherein
any one of a plurality of light-emitting elements configuring the same set has the same emission wavelength band, and
some of the sets of light-emitting elements have an emission wavelength band different from that of the other sets of light-emitting elements.

9. A color-matching apparatus comprising:
a board;
a resin frame fixed on the board;
a plurality of sets of light-emitting elements which are mounted in a region on the board surrounded by the resin frame, wherein the light-emitting elements configuring each of the sets are connected in series to each other;
a plurality of pairs of connection electrodes which are provided on the board, and electrically connected to the plurality of sets of light-emitting elements and capable of supplying a drive current selectively to some of the plurality of sets of light-emitting elements;
a sealing resin which comprises a phosphor mixed therein and excited by light from the plurality of sets of light-emitting elements, and is filled in such a way as to bury the region on the board surrounded by the resin frame, to seal integrally the plurality of sets of light-emitting elements with a single sealing resin; and
a constant-current power supply connected to at least one of the plurality of pairs of connection electrodes, for supplying a drive current to a corresponding one of the plurality of sets of light-emitting elements so that light having a chromaticity corresponding to the set is emitted through the sealing resin,
wherein a thickness of the sealing resin immediately above the plurality of sets of light-emitting elements differs for the respective sets, and thereby, a chromaticity of light emitted from the sealing resin differs when each of the sets of light-emitting elements emits the light singly, and wherein the light-emitting elements within each of the sets are placed at the same depth from an upper surface of the sealing resin, and the light-emitting elements of different sets are placed at different depths from the upper surface of the sealing resin.

\* \* \* \* \*